(12) United States Patent
Kanakasabapathy et al.

(10) Patent No.: US 12,532,675 B2
(45) Date of Patent: Jan. 20, 2026

(54) CORE REMOVAL

(71) Applicant: Lam Research Corporation, Fremont, CA (US)

(72) Inventors: Sivananda Krishnan Kanakasabapathy, Pleasanton, CA (US); Akhil Singhal, Beaverton, OR (US); Alan J. Jensen, Mountain House, CA (US); Seongjun Heo, Dublin, CA (US); Nishat Hasan, Portland, OR (US); Srividya Revuru, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 661 days.

(21) Appl. No.: 17/904,698

(22) PCT Filed: Feb. 8, 2021

(86) PCT No.: PCT/US2021/017066
§ 371 (c)(1),
(2) Date: Aug. 19, 2022

(87) PCT Pub. No.: WO2021/167809
PCT Pub. Date: Aug. 26, 2021

(65) Prior Publication Data
US 2023/0066676 A1 Mar. 2, 2023

Related U.S. Application Data

(60) Provisional application No. 62/980,038, filed on Feb. 21, 2020.

(51) Int. Cl.
*H01L 21/02* (2006.01)
*H01L 21/311* (2006.01)
*H01L 21/66* (2006.01)

(52) U.S. Cl.
CPC .... *H01L 21/0234* (2013.01); *H01L 21/02052* (2013.01); *H01L 21/311* (2013.01); *H01L 22/12* (2013.01)

(58) Field of Classification Search
CPC .......... H01L 21/0234; H01L 21/02052; H01L 21/311; H01L 22/12; H01L 21/31144;
(Continued)

(56) References Cited

U.S. PATENT DOCUMENTS 5,981,398 A 11/1999 Tsai et al.
6,632,741 B1 10/2003 Clevenger et al.
(Continued)

FOREIGN PATENT DOCUMENTS

CN 1691352 A 11/2005
CN 101345191 A 1/2009
(Continued)

OTHER PUBLICATIONS

CN Office Action dated Apr. 28, 2020, in Application No. CN201410625311.7 with English translation.
(Continued)

*Primary Examiner* — Duy Vu N Deo
(74) *Attorney, Agent, or Firm* — Weaver Austin Villeneuve & Sampson LLP

(57) ABSTRACT

Methods, apparatus, and systems are provided herein for processing a substrate. Generally, the processing involves Spacer-on-Spacer (SoS) Self-Aligned Quadruple Patterning (SAQP) techniques. The disclosed techniques provide a novel process flow that reduces defects by ensuring that cores are not removed from the substrate until the substrate is transferred to a deposition chamber used to deposit a second spacer layer. This reduces or eliminates the risk of structural damage to features on the substrate while the substrate is being transferred or cleaned. Such structural
(Continued)

damage is common when the cores are removed from the substrate prior to cleaning and transfer.

19 Claims, 14 Drawing Sheets

(58) Field of Classification Search
CPC ............ H01L 21/0337; H01J 37/32862; H01J 37/32899; H10D 48/031; G01B 11/0675; G01B 11/0683; G01B 2210/56; G01N 21/718; G01N 2201/1222
USPC ........................................................ 216/41
See application file for complete search history.

(56) References Cited

U.S. PATENT DOCUMENTS

| | | | |
|---|---|---|---|
| 7,824,492 B2 | 11/2010 | Tois et al. | |
| 8,623,770 B1 | 1/2014 | Gao et al. | |
| 9,362,133 B2 | 6/2016 | Shamma et al. | |
| 9,390,909 B2 | 7/2016 | Pasquale et al. | |
| 9,905,423 B2 | 2/2018 | Pasquale et al. | |
| 10,134,579 B2 | 11/2018 | Baldasseroni et al. | |
| 10,192,742 B2 | 1/2019 | Pasquale et al. | |
| 10,192,759 B2 | 1/2019 | Shamma et al. | |
| 10,832,908 B2 | 11/2020 | LaVoie | |
| 2002/0001889 A1 | 1/2002 | Kim et al. | |
| 2004/0025791 A1 | 2/2004 | Chen et al. | |
| 2004/0235303 A1 | 11/2004 | Wong et al. | |
| 2005/0142878 A1 | 6/2005 | Jung | |
| 2005/0236652 A1 | 10/2005 | Kijima et al. | |
| 2006/0119248 A1 | 6/2006 | Howard et al. | |
| 2006/0263699 A1 | 11/2006 | Abatchev et al. | |
| 2006/0273456 A1 | 12/2006 | Sant et al. | |
| 2007/0007635 A1 | 1/2007 | Forbes et al. | |
| 2007/0018214 A1 | 1/2007 | Ahn et al. | |
| 2007/0099431 A1 | 5/2007 | Li | |
| 2007/0148968 A1 | 6/2007 | Kwon et al. | |
| 2007/0212850 A1 | 9/2007 | Ingle et al. | |
| 2007/0224823 A1 | 9/2007 | Sandhu | |
| 2007/0225823 A1 | 9/2007 | Hawkins et al. | |
| 2008/0237726 A1 | 10/2008 | Dyer | |
| 2008/0293249 A1 | 11/2008 | Cho et al. | |
| 2009/0305506 A1 | 12/2009 | Linz | |
| 2010/0144150 A1 | 6/2010 | Sills et al. | |
| 2010/0267238 A1 | 10/2010 | Johnson et al. | |
| 2010/0311251 A1 | 12/2010 | Okada et al. | |
| 2011/0076850 A1 | 3/2011 | Sumioka | |
| 2012/0011889 A1 | 1/2012 | Bogdahn et al. | |
| 2012/0068347 A1 | 3/2012 | Isobayashi et al. | |
| 2012/0115074 A1 | 5/2012 | Zhang et al. | |
| 2012/0115250 A1 | 5/2012 | Ariga et al. | |
| 2012/0164846 A1 | 6/2012 | Ha et al. | |
| 2012/0171846 A1 | 7/2012 | Hwang | |
| 2012/0202301 A1 | 8/2012 | Yaegashi | |
| 2012/0244711 A1 | 9/2012 | Yin et al. | |
| 2012/0264305 A1 | 10/2012 | Nakano | |
| 2012/0329268 A1 | 12/2012 | Soda et al. | |
| 2013/0023120 A1 | 1/2013 | Yaegashi et al. | |
| 2013/0032949 A1 | 2/2013 | Lin et al. | |
| 2013/0084688 A1 | 4/2013 | O'Meara et al. | |
| 2013/0122686 A1 | 5/2013 | Chang et al. | |
| 2013/0217233 A1 | 8/2013 | Chang et al. | |
| 2013/0313583 A1 | 11/2013 | Hwang et al. | |
| 2014/0054534 A1 | 2/2014 | Pellizzer et al. | |
| 2014/0134812 A1 | 5/2014 | Kim et al. | |
| 2014/0170853 A1 | 6/2014 | Shamma et al. | |
| 2015/0056540 A1 | 2/2015 | Fukuda | |
| 2015/0155198 A1 | 6/2015 | Tsai et al. | |
| 2015/0162416 A1 | 6/2015 | Chang et al. | |
| 2015/0200110 A1 | 7/2015 | Li et al. | |
| 2015/0249153 A1 | 9/2015 | Morin et al. | |
| 2015/0251917 A1 | 9/2015 | Hong et al. | |
| 2016/0020092 A1 | 1/2016 | Kang et al. | |
| 2016/0042950 A1 | 2/2016 | Dai et al. | |
| 2016/0064224 A1 | 3/2016 | Hung et al. | |
| 2016/0099143 A1 | 4/2016 | Yan et al. | |
| 2016/0109804 A1 | 4/2016 | Huli | |
| 2016/0148800 A1 | 5/2016 | Henri et al. | |
| 2016/0172194 A1 | 6/2016 | Kunnen et al. | |
| 2016/0225640 A1* | 8/2016 | Raley | H01L 21/32137 |
| 2016/0247678 A1 | 8/2016 | Feng et al. | |
| 2016/0293418 A1 | 10/2016 | Pasquale et al. | |
| 2016/0307769 A1 | 10/2016 | Tseng et al. | |
| 2016/0336187 A1 | 11/2016 | Liou et al. | |
| 2016/0365425 A1 | 12/2016 | Chen et al. | |
| 2016/0372334 A1 | 12/2016 | Mignot et al. | |
| 2017/0092496 A1 | 3/2017 | Devilliers | |
| 2018/0012761 A1 | 1/2018 | Chang et al. | |
| 2018/0051368 A1* | 2/2018 | Liu | H01J 37/3435 |
| 2019/0237341 A1 | 8/2019 | Yu et al. | |
| 2019/0295906 A1* | 9/2019 | Clark | H01L 21/3086 |
| 2019/0334035 A1* | 10/2019 | Chang | H10D 30/024 |

FOREIGN PATENT DOCUMENTS

| | | |
|---|---|---|
| CN | 102428544 A | 4/2012 |
| CN | 103839783 A | 6/2014 |
| CN | 108183071 A | 6/2018 |
| JP | 2010103539 A | 5/2010 |
| JP | 2011071279 A | 4/2011 |
| JP | 2012094652 A | 5/2012 |
| JP | 2012142574 A | 7/2012 |
| JP | 2013153164 A | 8/2013 |
| JP | 2015050358 A | 3/2015 |
| JP | 2016143890 A | 8/2016 |
| JP | 2018085504 A | 5/2018 |
| JP | 2020004747 A | 1/2020 |
| KR | 20090060198 A | 6/2009 |
| KR | 20100028050 A | 3/2010 |
| KR | 20110099286 A | 9/2011 |
| KR | 101274960 B1 | 6/2013 |
| KR | 20140041344 A | 4/2014 |
| KR | 20160123960 A | 10/2016 |
| KR | 101860251 B1 | 5/2018 |
| KR | 20180053238 A | 5/2018 |
| SG | 10201709240Q A | 6/2018 |
| TW | 201833992 A | 9/2018 |
| WO | WO-2010134176 A1 | 11/2010 |

OTHER PUBLICATIONS

CN Office Action dated Feb. 4, 2017, in Application No. CN201410625311.7 with English translation.
CN Office Action dated Jul. 5, 2022, in Application No. CN202010119340.1 with English translation.
CN Office Action dated Jul. 10, 2018, in Application No. CN201410625311.7 with English translation.
CN Office Action dated Jun. 21, 2019, in Application No. CN201410625311.7 with English translation.
CN Office action dated Oct. 25, 2021 in CN Application No. CN202010119340.1 with English translation.
CN Office Action dated Sep. 22, 2017, in Application No. CN201410625311.7 with English translation.
International Preliminary Report on Patentability dated Sep. 1, 2022, in PCT Application No. PCT/US2021/017066.
International Preliminary Report on Patentability dated May 23, 2019 issued in Application No. PCT/US17/60692.
International Search Report and Written Opinion dated Feb. 13, 2018 issued in Application No. PCT/US2017/060692.
JP Office Action dated Oct. 1, 2019, in Application No. JP2014-226067 with English translation.
JP Office Action dated Oct. 16, 2018, in Application No. JP2014-226067 with English translation.
KR Office Action dated Aug. 18, 2022, in Application No. KR10-2021-0169392 with English translation.
KR Office Action dated Feb. 18, 2022, in Application No. KR1020210169392 with English translation.
KR Office Action dated Jan. 30, 2021, in Application No. 10-2014-0154559 with English translation.

(56) References Cited

OTHER PUBLICATIONS

KR Office Action dated Jul. 30, 2021, in Application No. KR10-2014-0154559 with English translation.
KR office action dated Mar. 3, 2022, in application No. 10-2014-0154559 with English translation.
KR Office Action dated Mar. 4, 2022, in Application No. KR10-2019-7017087 with English Translation.
KR Office Action dated May 28, 2020, in Application No. KR10-2013-0156795 with English translation.
KR Office Action dated Nov. 30, 2021 in Application No. KR10-2019-7017087 with English Translation.
Kunnen, E. et al., "A way to integrate multiple block layers for middle of line contact patterning", in Advanced Etch Technology for Nanopatterning IV, Edited by Qinghuam Lin and Sebastian Engelmann, Mar. 17, 2015, Proc. of SPIE, vol. 9428, 94280W1-8, 8 pages. [Downloaded on Jun. 27, 2017 from http://proceedings.spiedigitallibrary.org].
TW Office Action dated Feb. 9, 2017, in Application No. TW102146185 with English translation.
U.S. Ex Parte Quayle Action dated Oct. 8, 2015, in U.S. Appl. No. 14/194,324.
U.S. Final Office Action dated Jan. 2, 2018 issued in U.S. Appl. No. 15/351,221.
U.S. Final Office Action dated Nov. 25, 2015, in U.S. Appl. No. 14/101,901.
U.S. Non-Final Office Action dated Aug. 4, 2015, in U.S. Appl. No. 14/101,901.
U.S. Non-Final Office Action dated Aug. 10, 2018, in U.S. Appl. No. 15/150,239.
U.S. Non-Final Office Action dated Jul. 5, 2017 issued in U.S. Appl. No. 15/351,221.
U.S. Non-Final Office Action dated Mar. 24, 2017, in U.S. Appl. No. 15/177,108.
U.S. Non-Final Office Action dated Mar. 26, 2018, in U.S. Appl. No. 15/874,766.
U.S. Notice of Allowance dated Feb. 10, 2016, in U.S. Appl. No. 14/101,901.
U.S. Notice of Allowance dated Jul. 16, 2018 issued in U.S. Appl. No. 15/351,221.
U.S. Notice of Allowance dated Mar. 9, 2016, in U.S. Appl. No. 14/194,324.
U.S. Notice of Allowance dated Nov. 26, 2018, in U.S. Appl. No. 15/150,239.
U.S. Notice of Allowance dated Oct. 18, 2017, in U.S. Appl. No. 15/177,108.
U.S. Notice of Allowance dated Sep. 6, 2018, in U.S. Appl. No. 15/874,766.
U.S. Restriction Requirement dated Apr. 28, 2015, in U.S. Appl. No. 14/194,324.
U.S. Restriction Requirement dated May 11, 2015 in U.S. Appl. No. 14/101,901.
JP Office Action dated Oct. 8, 2024 in JP Application No. 2022-549851 with English translation.
Knoops H., et al., "Status and Prospects of Plasma-assisted Atomic Layer Deposition," Journal of Vacuum Science & Technology a Vacuum Surfaces and Films, 2019, vol. 37 (3), pp. 1-27.
KR Office Action dated Jul. 18, 2025 in KR Application No. 10-2022-7032629, with English Translation.

\* cited by examiner

CORE REMOVAL

INCORPORATION BY REFERENCE

A PCT Request Form is filed concurrently with this specification as part of the present application. Each application that the present application claims benefit of or priority to, as identified in the concurrently filed PCT Request Form, is incorporated by reference herein in their entireties for all purposes.

BACKGROUND

As semiconductor device dimensions continue to shrink, such devices become increasingly challenging to fabricate. One area where issues arise is the patterning of features on a semiconductor substrate. Multipatterning techniques such as self-aligned double patterning (SADP) and self-aligned quadruple patterning (SAQP) have been used to enable patterning of very small features.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Various embodiments herein relate to methods and apparatus for processing a substrate in a spacer-on-spacer self-aligned quadruple patterning scheme.

In one aspect of the disclosed embodiments, a method of processing substrates is provided, the method including: (a) receiving a substrate including: (i) underlying material, (ii) cores positioned on the underlying material, the cores having sidewalls that are vertically oriented, and (iii) first spacer material lining the sidewalls of the cores; (b) removing the cores, thereby forming first spacer features from the first spacer material previously lining the sidewalls of the cores; and (c) depositing a second spacer layer over the first spacer features, where (b) and (c) occur in the same reaction chamber, and where the substrate is not removed from the reaction chamber between (b) and (c).

In some embodiments, the method further includes cleaning the substrate to remove unwanted material therefrom, where the substrate is cleaned in a wet cleaning operation prior to (b). In these or other embodiments, the method may further include depositing a first spacer layer over the cores, the first spacer layer including the first spacer material, and etching back the first spacer layer to remove the first spacer material from horizontal surfaces while leaving the first spacer material on the sidewalls of the cores.

In these or other embodiments, the method may further include performing metrology to determine a time at which the cores are removed during (b). In some such cases, performing metrology may include performing optical emission spectroscopy. For example, performing optical emission spectroscopy may include monitoring a signal associated with the presence of carbon dioxide in the reaction chamber. In these or other embodiments, performing metrology may include performing laser interferometry. In these or other embodiments, the method may include performing scatterometry after (b) and before (c) to measure a width of one or more of the first spacer features.

In these or other embodiments, removing the cores may include exposing the substrate to an oxygen-containing plasma to ash away the cores. In these or other embodiments, the cores may include carbon, where the carbon of the cores has a post-deposition blanket stress of about 50 MPa or less, and has a Young's modulus of about 30 GPa or greater.

In another aspect of the disclosed embodiments, a method of processing substrates is provided, the method including: (a) receiving a substrate including: (i) underlying material, (ii) cores positioned on the underlying material, the cores having sidewalls that are vertically oriented, (iii) first spacer material lining the sidewalls of the cores, (iv) planarizing layer positioned over the cores and first spacer material, a top portion of the planarizing layer being substantially planar, (v) a mask layer positioned over the planarizing layer, (vi) an opening defined in the mask layer and the planarizing layer, the opening positioned above the first spacer material lining one of the sidewalls of one of the cores; (b) removing the first spacer material at a location corresponding to the opening; (c) removing the mask layer; (d) removing the cores and the planarizing layer, thereby forming first spacer features from remaining first spacer material that was not removed in (b), where no first spacer feature is formed at the location corresponding to the opening; and (e) depositing a second spacer layer over the first spacer features, where (d) and (e) occur in the same reaction chamber, and where the substrate is not removed from the reaction chamber between (d) and (e).

In some embodiments, the cores and the planarizing layer may be removed simultaneously. In these or other embodiments, removing the cores and the planarizing layer may include exposing the substrate to an oxygen-containing plasma to ash away the cores and the planarizing layer. In these or other embodiments, the method may further include performing metrology to determine a time at which the cores and/or planarizing layer are removed in (d). In these or other embodiments, the method may further include performing scatterometry after (d) and before (e) to measure a width of one or more of the first spacer features.

In a further aspect of the disclosed embodiments, a method of processing a substrate is provided, the method including: (a) receiving a substrate including: (i) underlying material, (ii) cores positioned on the underlying material, the cores having sidewalls that are vertically oriented, (iii) first spacer material lining the sidewalls of the cores, and (iv) a planarizing layer positioned over the underlying material, the cores, and the first spacer material, where the planarizing layer is patterned to form exposed regions and protected regions; (b) trimming the first spacer material to reduce a thickness of the first spacer material in the exposed regions while the first spacer material in the protected regions remains untrimmed; (c) removing the planarizing layer and the cores, thereby forming first spacer features from the first spacer material, wherein the first spacer features have non-uniform critical dimensions; and (d) forming a second spacer layer over the first spacer features, wherein (c) and (d) occur in the same reaction chamber, and the wherein the substrate is not removed from the reaction chamber between (c) and (d).

In another aspect of the disclosed embodiments, an apparatus for processing a substrate is provided, the apparatus including: (a) a reaction chamber; (b) a substrate support positioned within the reaction chamber; (c) a plasma generator configured to generate a plasma within the reaction chamber; (d) one or more inlets to the reaction chamber; and (e) a controller having at least one processor configured to cause: (i) receiving a substrate including: (1) underlying material, (2) cores positioned on the underlying material, the cores having sidewalls that are vertically oriented, and (3) first spacer material lining the sidewalls of the cores; (ii) removing the cores, thereby forming first spacer features from the first spacer material previously lining the sidewalls of the cores; and (iii) depositing a second spacer layer over the first spacer features, where (e)(ii) and (e)(iii) occur in the reaction chamber, and the substrate is not removed from the reaction chamber between (e)(ii) and (e)(iii).

In some embodiments, the apparatus further includes a memory. The memory and the controller may be communicatively connected with one another. The memory may store computer executable instructions for controlling the processor to cause any of the operations described herein. In other cases, such computer executable instructions may be stored in another location (e.g., in some cases a remote location) and provided to the processor.

In some embodiments, the apparatus further includes optical emission spectroscopy hardware and/or laser interferometry hardware. In some such embodiments, the controller may be configured to cause extinguishing a plasma exposed to the substrate in response to feedback from the optical emission spectroscopy hardware and/or from the laser interferometry hardware indicating that the cores are removed. In these or other embodiments, the apparatus may further include scatterometry hardware. In some such embodiments, the controller may be configured to cause measuring a width of one or more of the first spacer features after (e)(ii) and before (e)(iii).

In another aspect of the disclosed embodiments, an apparatus for processing a substrate is provided, the apparatus including: (a) a reaction chamber; (b) a substrate support positioned within the reaction chamber; (c) a plasma generator configured to generate a plasma within the reaction chamber; (d) one or more inlets to the reaction chamber; and (e) a controller having at least one processor configured to cause: (i) receiving a substrate including (1) underlying material, (2) cores positioned on the underlying material, the cores having sidewalls that are vertically oriented, (3) first spacer material lining the sidewalls of the cores, (4) a planarizing layer positioned over the cores and first spacer material, a top portion of the planarizing layer being substantially planar, (5) a mask layer positioned over the planarizing layer, and (6) an opening defined in the mask layer and the planarizing layer, the opening positioned above the first spacer material lining one of the sidewalls of one of the cores; (ii) removing the first spacer material at a location corresponding to the opening; (iii) removing the mask layer; (iv) removing the cores and the planarizing layer, thereby forming first spacer features from remaining first spacer material that was not removed in (ii), wherein no first spacer feature is formed at the location corresponding to the opening; and (v) depositing a second spacer layer over the first spacer features, where (iv) and (v) occur in the same reaction chamber, and wherein the substrate is not removed from the reaction chamber between (d) and (e).

In some embodiments, the controller is configured to cause removing the cores and the planarizing layer simultaneously. In these or other cases, removing the cores and the planarizing layer may include exposing the substrate to an oxygen-containing plasma to ash away the cores and the planarizing layer. In various embodiments, the controller may be configured to cause performing metrology to determine a time at which the cores and/or planarizing layer are removed in (iv). In these or other embodiments, the controller may be configured to cause performing scatterometry after (iv) and before (v) to measure a width of one or more of the first spacer features.

In another aspect of the disclosed embodiments, an apparatus for processing substrates is provided, the apparatus including: (a) a reaction chamber; (b) a substrate support positioned within the reaction chamber; (c) a plasma generator configured to generate a plasma within the reaction chamber; (d) one or more inlets to the reaction chamber; and (e) a controller having at least one processor configured to cause: (i) receiving a substrate including (1) underlying material, (2) cores positioned on the underlying material, the cores having sidewalls that are vertically oriented, (3) first spacer material lining the sidewalls of the cores, (4) a planarizing layer positioned over the cores and first spacer material, where the planarizing layer is patterned to form exposed regions and protected regions; (ii) trimming the first spacer material to reduce a thickness of the first spacer material in the exposed regions while the first spacer material in the protected regions remains untrimmed; (iii) removing the planarizing layer and the cores, thereby forming first spacer features from the first spacer material, where the first spacer features have non-uniform critical dimensions; and (iv) forming a second spacer layer over the first spacer features, where (iii) and (iv) occur in the same reaction chamber, and where the substrate is not removed from the reaction chamber between (iii) and (iv).

In certain embodiments, the controller may be configured to cause etching back the second spacer layer such that the second spacer layer is removed in areas between adjacent first spacer features. In some such cases, the controller may be configured to cause removing the first spacer features, thereby forming second spacer features from the second spacer layer, where a distance between adjacent seconds spacer features is non-uniform due to the non-uniform critical dimensions of the first spacer features. In these or other embodiments, the planarizing layer and the cores may be removed simultaneously. In these or other embodiments, the controller may be configured to cause exposing the substrate to an oxygen-containing plasma to ash away the cores and the planarizing layer.

In another aspect of the disclosed embodiments, an apparatus for processing a substrate is provided, the apparatus including: (a) a reaction chamber; (b) a substrate support positioned within the reaction chamber; (c) a plasma generator configured to generate a plasma within the reaction chamber; (d) one or more inlets to the reaction chamber; and (e) a controller having at least one processor, where the controller is configured to cause any of the methods claimed or otherwise described herein.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Figure 1:
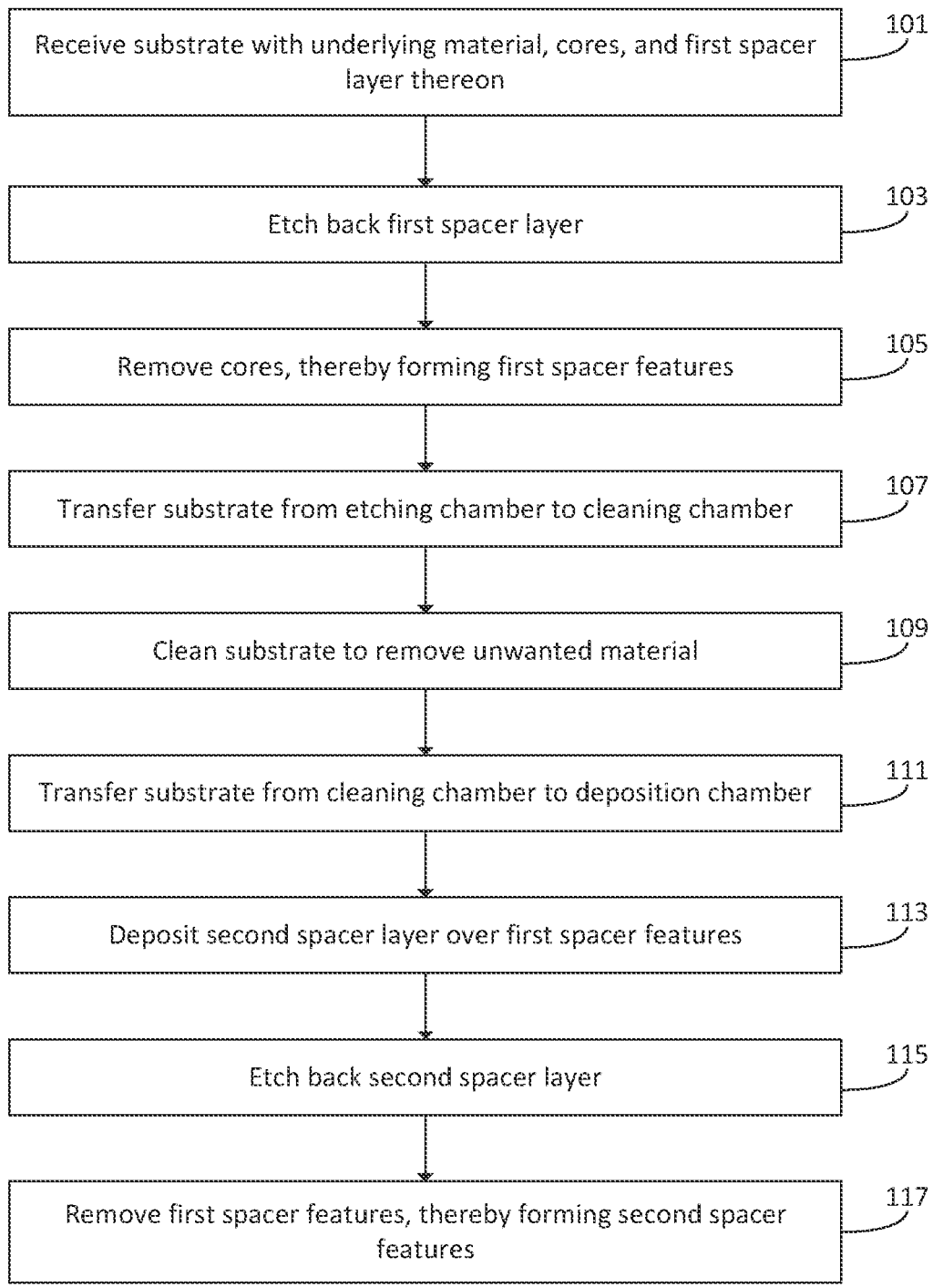
FIG. 1 is a flowchart describing a method of spacer-on-spacer self-aligned quadruple patterning.

FIG. 1 is a flowchart that describes a patterning technique referred to as spacer-on-spacer self-aligned quadruple patterning. FIGS. 2A-2E illustrate a substrate 201 as it undergoes the operations shown in FIG. 1. The operations of FIG. 1 are described in the context of FIGS. 2A-2E. First, at operation 101, the substrate 201 is received. The substrate 201 includes underlying material 202, cores 203, and first spacer layer 204. As used herein, the phrase underlying material refers to material that is positioned below the cores. With reference to FIG. 1, underlying material 202 is positioned below the cores 203. The underlying material 202 is deposited prior to formation of the cores 203, and may include a variety of materials and structures. In various examples, the underlying material 202 includes one or more layers of materials, for example dielectric materials such as silicon oxide, silicon nitride, silicon carbonitride, and/or silicon carbide. The material(s) of the underlying material 202 are selected such that they can be etched using the material of the second spacer layer 205 as a mask, as discussed further below.

Figure 2A:
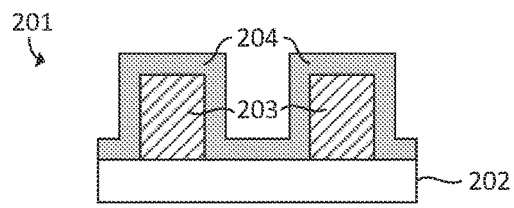
FIGS. 2A-2E illustrate a semiconductor substrate as it undergoes various steps in the method of FIG. 1.
Figure 2B:
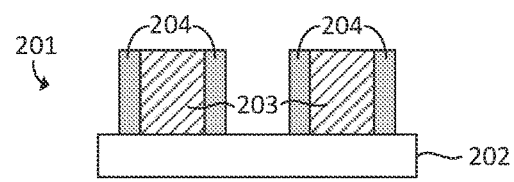
Figure 2C:
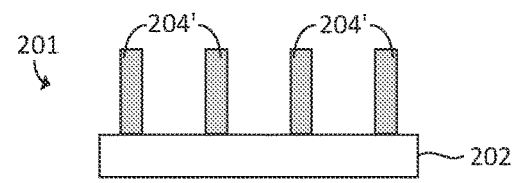

The first spacer layer 204 conformally coats the cores 203, as shown in FIG. 2A. Next, at operation 103, the first spacer layer 204 is etched back. The material of the first spacer layer 204 (sometimes referred to as the first spacer material) is removed from horizontally oriented surfaces, while being substantially preserved on vertically oriented surfaces, as shown in FIG. 2B. This etching operation occurs in a reaction chamber configured to perform etching. Next, at operation 105, the cores 203 are removed, as shown in FIG. 2C. At this point, the remaining portions of the first spacer layer 204 are separate and distinct vertically oriented features that may be referred to as first spacer features 204'.

At operation 107, the substrate 201 is removed from its support (often referred to as an electrostatic chuck) in the chamber configured to perform etching, and transferred to another chamber configured to perform wet cleaning. Then, at operation 109, the substrate 201 is subjected to a wet cleaning operation to remove any unwanted material. As one skilled in the art will understand, in one instance, this unwanted material can be generated while the first spacer layer 204 is being etched back in operation 103. In another instance, operation 105 performed to remove the cores 203 can result in undesirable material, such as polymeric residues, that can be removed in one or more cleaning processes. Next, at operation 111, the substrate 201 is transferred from the chamber configured to perform cleaning to a chamber configured to perform deposition.

Figure 2D:
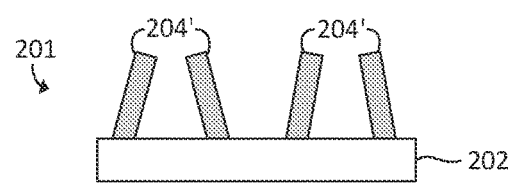

FIG. 2D illustrates the substrate 201 after it has been transferred for cleaning, cleaned, and transferred for deposition. A variety of forces acting on the substrate 201 can cause the first spacer features 204' to undesirably tip/lean, as shown in FIG. 2D. For example, mechanical vibrations may occur each time the substrate 201 is transported. Such mechanical vibrations may be especially problematic in operation 107, when the substrate 201 is removed from the substrate support used for etching the substrate. Etching apparatus often use electrostatic chucks that tightly secure the substrate 201 to the chuck during processing through application of a differential voltage. When the substrate 201 is dechucked (e.g., released/removed from the electrostatic chuck), it jumps slightly. This jump causes mechanical vibrations in the substrate 201, which can cause the first spacer features 204' to tip over. Similarly, capillary forces experienced during and after the wet cleaning process in operation 109 can cause the first spacer features 204' to tip over. For instance, as solvent from the wet cleaning process dries between neighboring pairs of first spacer features 204', the first spacer features 204' can be pulled toward one another, causing them to lean or collapse.

Figure 2E:
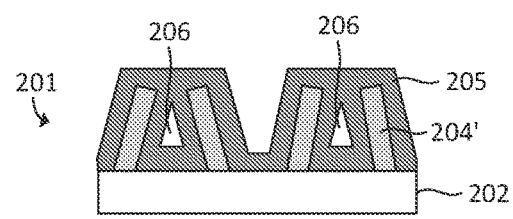

At operation 113, a second spacer layer 205 is deposited over the first spacer features 204', as shown in FIG. 2E. It is desirable for the second spacer layer 205 to be deposited conformally. However, because the first spacer features 204' were tipped over, voids 206 form between adjacent sets of first spacer features 204'. These voids 206 are undesirable and can lead to failure.

FIGS. 2A-2E illustrate one problem that frequently occurs during spacer-on-spacer SAQP techniques. It should be understood that the illustrated tipping problem does not necessarily occur at all locations on the substrate, or every time the method is performed. Rather, the figures are intended to show a problem that commonly occurs in spacer-on-spacer SAQP processing, causing a high rate of defects and an associated low yield.

It should also be understood that FIGS. 2A-2E omit the last two steps commonly performed in spacer-on-spacer SAQP techniques, though these steps are described in the flowchart of FIG. 1. Returning to FIG. 1, these steps include operation 115 to etch back the second spacer layer 205 to thereby remove it from horizontally oriented surfaces while leaving it substantially intact on vertically oriented surfaces. This step is similar to the etchback of the first spacer layer 204 in operation 103. Next, at operation 117, the first spacer layer features 204' are removed. This step is similar to removing the cores 203 in operation 105. After the first spacer features 204' are removed, the remaining (vertically oriented) portions of the second spacer layer 205 are separate and distinct from one another, forming second spacer features (not shown). FIGS. 2A-2E omit these last two steps because the features in FIG. 2E are already too compromised for further processing to be successful. As mentioned above, the material(s) of the underlying material 202 (or a top portion thereof) are selected such that the underlying material 202 can be etched using the second spacer features as a mask layer. In some cases, the underlying material 202 includes one or more layers of silicon nitride, silicon carbide, and/or silicon carbonitride. In some such cases, the second spacer layer 205 and second spacer features are silicon oxide. In some other cases, the second spacer layer 205 and second spacer features are silicon nitride. Other combinations of materials may be used in certain implementations.

In order to overcome the problems described above in relation to FIGS. 1 and 2A-2E, a new process flow is used. The new process flow delays removal of the cores until after the substrate is cleaned and transferred to a chamber for deposition of the second spacer layer. As such, the cores provide structural support during transfer and cleaning operations, thereby minimizing the risk that the first spacer features tip over during these steps. Because the cores are removed in the same chamber used for deposition of the second spacer layer, the core removal is considered to be performed in-situ to the second spacer deposition. The new process flow results in substantially fewer manufacturing defects, and therefore achieves a notably higher yield compared to conventional techniques.

Figure 3:
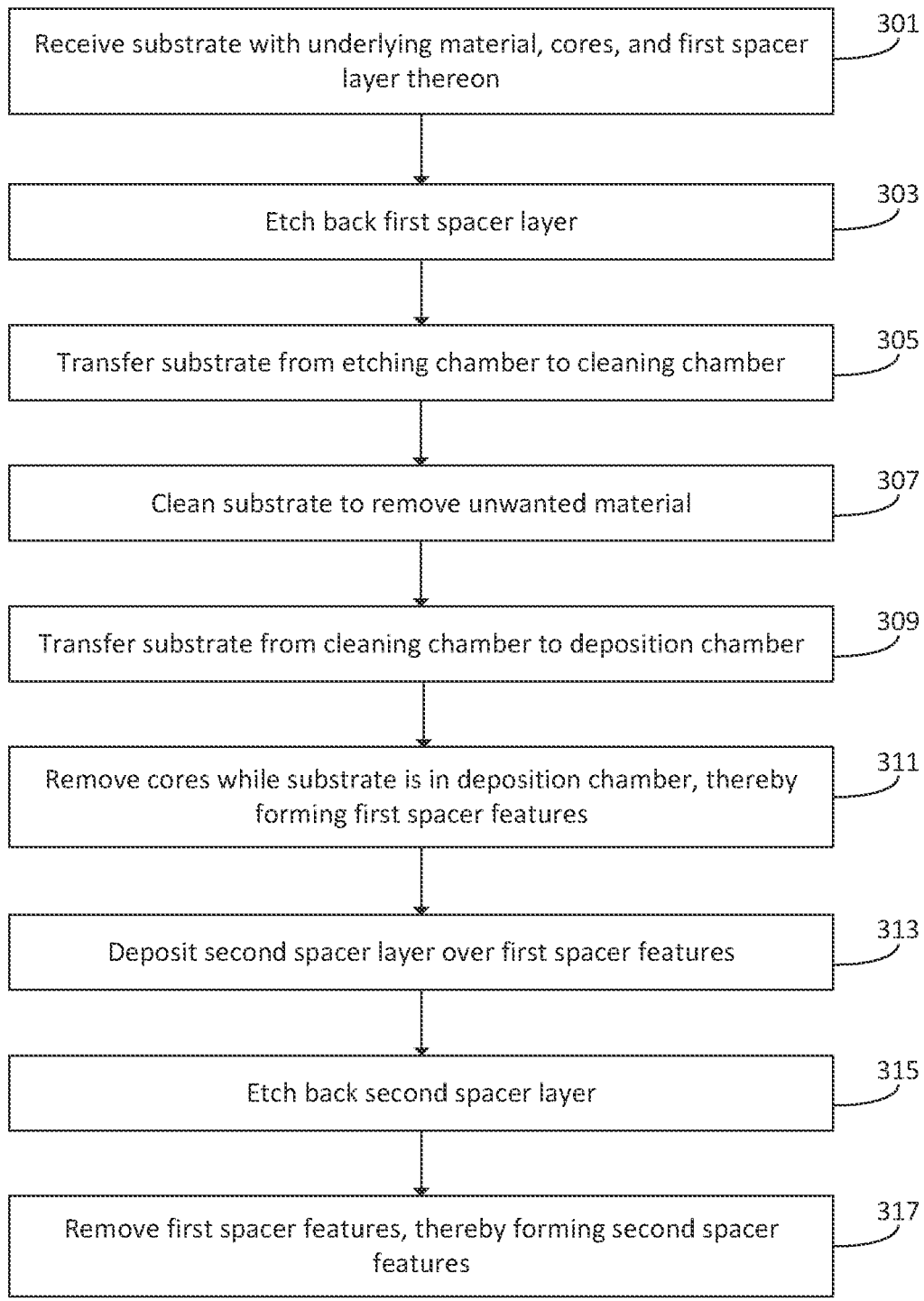
FIG. 3 is a flowchart describing a method of spacer-on-spacer self-aligned quadruple patterning using an alternative process flow in which the cores are removed in-situ to the second spacer deposition.

FIG. 3 presents a flowchart for performing spacer-on-spacer self-aligned quadruple patterning according to various embodiments herein. FIGS. 4A-4F illustrate a partially fabricated semiconductor device as it undergoes the method described in FIG. 3. The operations of FIG. 3 are described in the context of FIGS. 4A-4F.

Figure 4A:
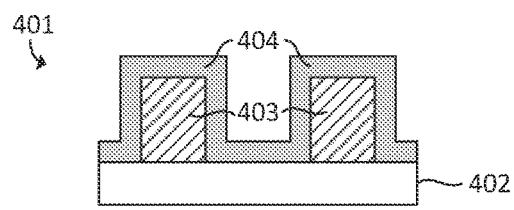
FIGS. 4A-4F show a semiconductor substrate as it undergoes various processing steps in the method of FIG. 3.

First, at operation 301, the substrate 401 is received. The substrate 401 includes underlying material 402, cores 403, and first spacer layer 404. The first spacer layer 404 conformally coats the cores 403, as shown in FIG. 4A. Generally, conventional materials may be used for each of these layers. In one embodiment, the cores can be fabricated, or can include, a material that is ashable without leaving behind any undesirable residual materials during an ashing process. As defined herein, an ashing process refers to a type of stripping process that removes one or more organic materials, such as photoresists, etc., upon exposure to heat or to plasma such as an oxygen-containing plasma or a hydrogen-containing plasma. In one example, the material of the core can include, or can be, selected from Group IVA of the periodic table, such as, for example, carbon, silicon, germanium, tin, lead, and the like. In some examples, the material of the core may include tin oxide, lead oxide, or a combination thereof. Combinations of any of these materials may also be used. In one specific example, the cores are carbon or a carbon-based material formed through spin-on, chemical vapor deposition, or plasma enhanced chemical vapor deposition (PECVD) methods. In these or other examples, the first spacer layer may be made of dielectric material such as silicon nitride, titanium oxide, tin oxide, hafnium oxide, or zirconium oxide. Other materials may be used as appropriate. The first spacer layer may be deposited through atomic layer deposition or chemical vapor deposition (either of which may be driven by plasma energy or thermal energy). In some cases, the method may further include the steps of forming the cores 403 on the underlying material 402 and depositing the first spacer layer 404 over the cores.

Next, at operation 303, the first spacer layer 404 is etched back. The material of the first spacer layer 404 (sometimes referred to as first spacer material) is removed from horizontally oriented surfaces, while being substantially preserved on vertically oriented surfaces, as shown in FIG. 4B. This etching operation occurs in a chamber configured to perform etching. The first spacer layer 404 may be etched back by exposing the substrate to a combination of etching chemistry, plasma, and a directed flux of ions configured to etch the material of the first spacer layer. The etching process is an anisotropic etch.

Next, at operation 305, the substrate 401 (for instance, having remaining material of the first spacer layer 404 adjoining the cores 403 disposed over the underlying material 402, as shown in FIG. 4B) is transferred from the chamber configured to perform etching to a chamber configured to perform cleaning. At operation 307, the substrate 401 is cleaned to remove unwanted material (not shown). The unwanted material is typically material present on the substrate 401 as a result of etching back the first spacer layer in operation 303. The cleaning process may be a wet clean process, for example using HF. The HF is diluted in water (e.g., deionized water), typically at a ratio of at least about 10:1 (water:HF), in some cases about 300:1, and in some cases up to about 1000:1. In certain embodiments, the HF solution may be a buffered solution. In these or other cases, the HF solution may include a mild basic reagent such as ammonium hydroxide and/or hydrogen peroxide. In some cases, the cleaning process may be a dry cleaning process. In such a case, the substrate may be exposed to plasma to remove the unwanted material.

In other cases, the cleaning process may be omitted entirely. For example, the material of the first spacer layer 404 and/or the material of the cores 403 may be selected such that they can be removed cleanly, e.g., without formation of non-volatile substances that re-deposit on the substrate. In such embodiments, there may be little or no unwanted material to remove in the cleaning operation. In embodiments where the cleaning is omitted, the transfer steps associated with cleaning may likewise be omitted. For instance, with reference to FIG. 3, operations 305, 307, and 309 may be replaced with a single operation involving transferring the substrate from the etching chamber to the deposition chamber. In another example, the etching chamber and the deposition chamber may be the same reaction chamber. In this case, operations 305, 307, and 309 may be omitted entirely.

One advantage of omitting the cleaning steps is that it reduces the number of times the substrate is transferred among different chambers and/or tools. This further lessens the risk that any features on the substrate become compromised during processing/transfer. In one example where the etching chamber and deposition chamber are the same reaction chamber (e.g., the reaction chamber is configured to etch and to deposit, as desired), omitting the cleaning operations eliminates the need to transfer the substrate between operations 303 (e.g., etching back the first spacer layer) and operation 311 (removing the cores, thereby forming first spacer features).

Returning to the embodiment of FIG. 3, at operation 309, the substrate 401 is transferred from the chamber configured to perform cleaning to a chamber configured to perform deposition. This may be the same or different chamber than was used to deposit the first spacer layer, and may also be the same or different chamber than was used to etch back the first spacer layer.

Notably, operations 305, 307, and 309 all occur while the cores 403 are still present on the substrate 401, as shown in FIG. 4B. In this way, the cores 403 provide mechanical support to the first spacer layer 404/first spacer features 404', preventing them from undesirably tipping over during the transfer and cleaning operations. Once the substrate is transferred to the deposition chamber where the second spacer layer will be deposited (discussed further below), the cores 403 are removed in operation 311, as shown in FIG. 4C. The cores may be removed through a dry process such as ashing. At this point, the remaining portions of the first spacer layer 404 are separate and distinct vertically oriented features that may be referred to as first spacer features 404'. The cores 403 may be removed by exposing the substrate to plasma configured to remove the material of the cores. As mentioned above, in one example, the cores 403 are carbon or a carbon-based material, and can be removed by exposing the substrate to an oxygen-containing plasma. Example reactants include $O_2$ and other oxygen-containing species. In some other examples, the cores 403 may include one or more metal oxide material (e.g., tin oxide, lead oxide, etc.), and can be removed by exposing the substrate to a hydrogen-containing plasma. Example reactants that may be used include $H_2$, $NH_3$, $CH_4$, and other hydrogen-containing species. In a particular example, the plasma includes a mix of $H_2$ and $N_2$. Oxidizing and reducing plasmas may be used as appropriate to remove particular core materials.

Figure 4D:
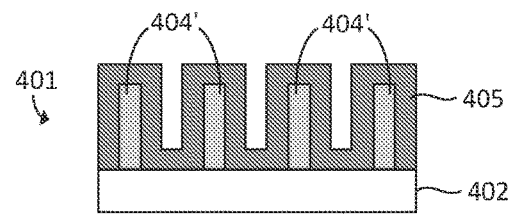
Figure 4B:
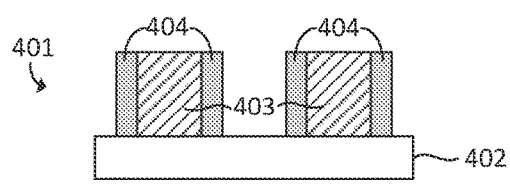

Then, at operation 313, the second spacer layer 405 is deposited over the first spacer features 404', as shown in FIG. 4D. The second spacer layer 405 may be deposited through atomic layer deposition or chemical vapor deposition (either of which may be driven by plasma energy or thermal energy). The second spacer layer 405 may be a dielectric material such as silicon oxide, silicon nitride, titanium oxide, tin oxide, zirconium oxide, hafnium oxide, etc. Generally, the material of the first spacer layer 404 should have a different composition than the material of the second spacer layer 405. Various combinations of materials can be used for the first and second spacer layers 404 and 405.

In one example, the cores 403 are carbon or a carbon-based material, the first spacer layer 404 is tin oxide or titanium oxide, and the second spacer layer 405 is silicon oxide or silicon nitride. In another example, the cores 403 are carbon or a carbon-based material, the first spacer layer 404 is silicon oxide or silicon nitride, and the second spacer layer 405 is tin oxide, titanium oxide, or lead oxide. In another example, the cores 403 are a tin oxide, lead oxide, or a combination thereof, the first spacer layer 404 is titanium oxide, and the second spacer layer 405 is any oxide (e.g., silicon oxide, metal oxide, etc.) or silicon nitride.

The process flow described in FIG. 3 ensures that the first spacer features 404' remain vertical, without tipping over as described in relation to FIGS. 1 and 2D. As such, the second spacer layer 405 deposits conformally on the first spacer features 404', without the formation of voids or other undesirable defects described in relation to FIG. 2E.

Figure 4E:
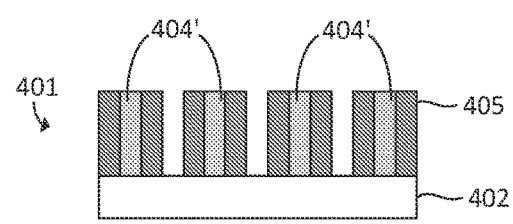
Figure 4C:
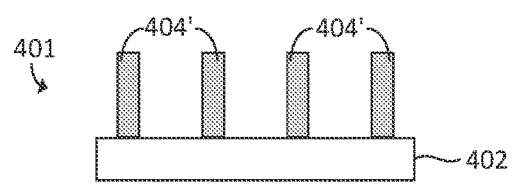

Next, at operation 315, the second spacer layer 405 is etched back, as shown in FIG. 4E. The etchback operation removes the second spacer layer 405 from horizontal surfaces while substantially preserving it on vertical surfaces. The second spacer layer 405 may be etched back by exposing the substrate to a combination of etching chemistry, plasma, and a directed flux of ions configured to etch the material of the second spacer layer. The etch process is an anisotropic etch process.

Figure 4F:
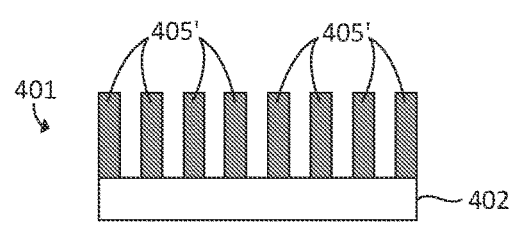

At operation 317, the first spacer features 404' are removed, as shown in FIG. 4F. At this point, the remaining portions of the second spacer layer 405 are separate and distinct from one another, forming second spacer features 405'. The first spacer features 404' may be removed by ashing/exhuming in a low bias (e.g., ≤10 V) isotropic selective etch. The first spacer features 404' are selectively removed without significantly etching the underlying material 402 of the substrate 401 or the second spacer features 405'.

As mentioned above, the core may be carbon or a carbon-containing material, or a metal oxide material. In various embodiments, the core may have particular material properties. For example, the material of the core may exhibit relatively low stress (e.g., having a post deposition blanket stress with an absolute value of about 50 MPa or less) and high Young's modulus (e.g., greater than 30 GPa). In certain embodiments, the material of the core may be ashable, for example when exposed to plasma such as an oxygen-containing plasma or hydrogen-containing plasma. An ashing reaction produces volatile products from at least one solid phase reactant, with little to no formation of polymers or other non-volatile substances that could re-deposit on the substrate. In the case of a carbon or carbon-containing core, the carbon may be reacted with an oxygen-containing plasma to form volatile carbon dioxide. In the case of a metal oxide-based core, the metal oxide may be removed with a hydrogen-containing plasma.

As shown in FIGS. 4A-4F, the disclosed process flow may be used to quadruple the number of features present on a substrate surface. The process is generally referred to as Spacer-on-Spacer (SoS) Self-Aligned Quadruple Patterning (SAQP). The specific process flow described in FIG. 3 may be referred to as Core Pull In-Situ to Second Spacer Deposition (CoPS). The name is derived from the fact that the cores are removed in-situ to (e.g., in the same chamber as) the second spacer deposition. The CoPS process flow results in substantially fewer manufacturing defects, thereby minimizing the number of substrates/devices that are non-functional, reducing waste, and increasing efficiency. As a result, manufacturing costs are reduced.

It should be understood that while FIGS. 3 and 4A-4F lay out a number of different steps, certain operations may be omitted in various embodiments. Similarly, additional steps may take place in some embodiments. With reference to FIG. 3, one embodiment involves just operation 311. Another embodiment involves operations 311 and 313. Another embodiment involves operations 311, 313, and 315. Another embodiment involves operations 311, 313, 315, and 317. Any of these embodiments can be modified to include any one or more of operations 301, 303, 305, and 307.

Figure 5:
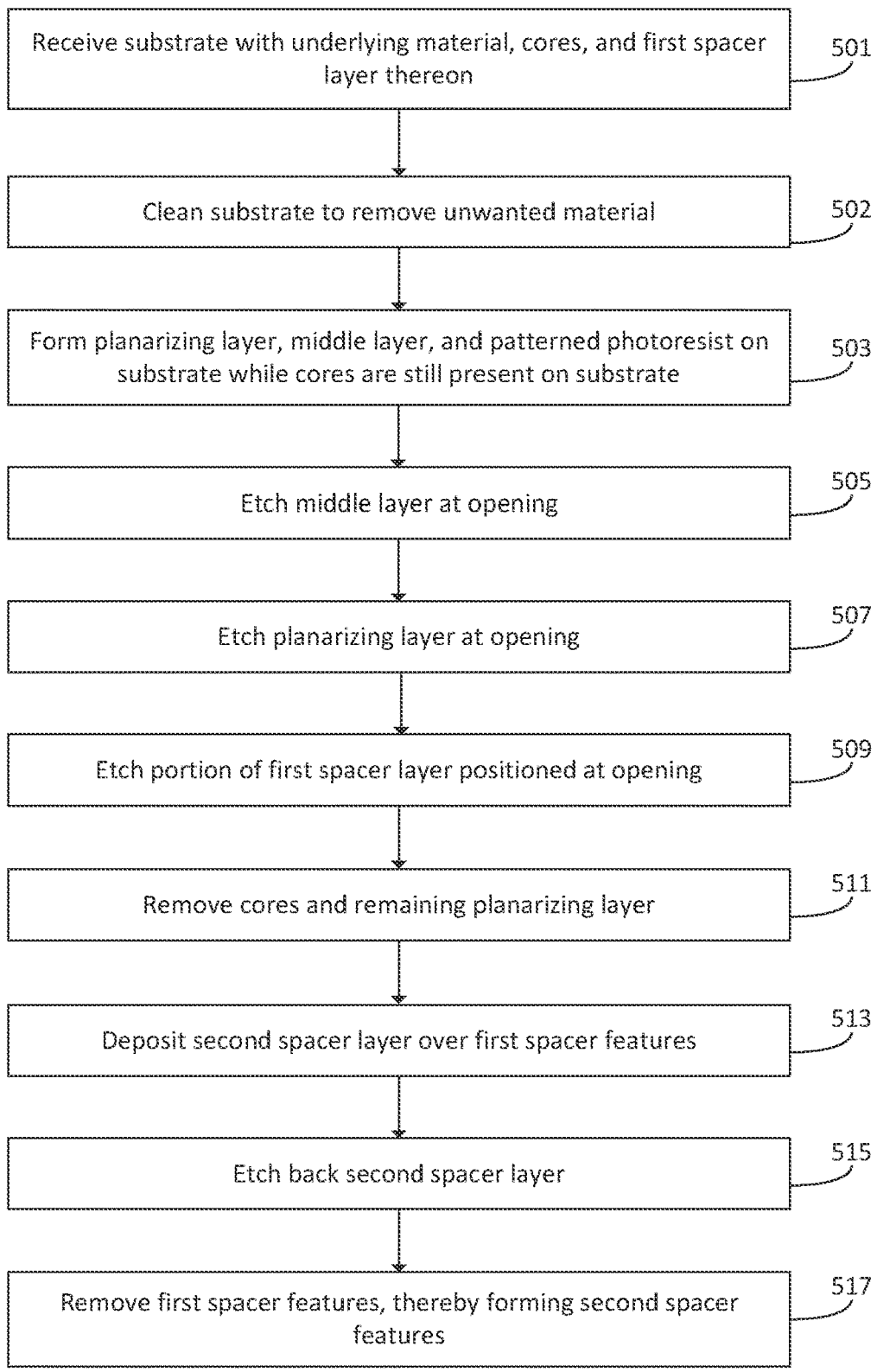
FIG. 5 is a flowchart describing a method of spacer-on-spacer self-aligned patterning where certain first spacer features are targeted for removal before they are doubled.

The process flow described in FIGS. 3 and 4A-4F works well in contexts where it is desired that the number of features is quadrupled, such as fabrication of memory devices. Some other devices (e.g., logic devices) may have more complex structures, and in such cases, it may be desired that the number of features is increased by a factor less than four. In such cases, certain features (e.g., first spacer features) may be targeted for removal before they are used to double a pattern. FIG. 5 is a flowchart describing such an embodiment, sometimes referred to as a cut mask integration scheme. The method of FIG. 5 is explained in the context of FIGS. 6A-6I, which show a partially fabricated semiconductor device as it undergoes the operations of FIG. 5. Generally, many of the operations in FIG. 5 are analogous to those in FIG. 3, and details provided in relation to FIG. 3 also apply to the method of FIG. 5. For the sake of brevity, many such details are omitted from the description of FIG. 5.

Figure 6A:
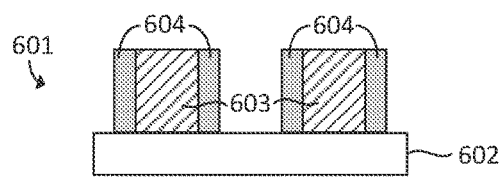
FIGS. 6A-6I depict a semiconductor substrate as it undergoes various processing steps in the method of FIG. 5.

The method of FIG. 5 begins with operation 501, where a substrate 601 is received. The substrate 601 includes underlying layer 602, cores 603, and first spacer layer 604, as shown in FIG. 6A. Steps related to deposition of the cores 603 and first spacer layer 604, as well as etchback of the first spacer layer 604 (analogous to operation 303) are omitted from the figures, though these steps may be included in certain embodiments. Certain substrate transfer steps are also omitted from the figures, though it is understood that the substrate is transferred to different tools as necessary for each step. The method continues with operation 502, where the substrate is subjected to cleaning to remove unwanted material. This unwanted material is frequently generated during etchback of the first spacer layer 604. As discussed with reference to FIG. 3, the cleaning operation 502 may be omitted in certain embodiments.

Figure 6F:
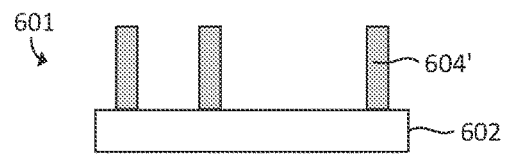
Figure 6B:
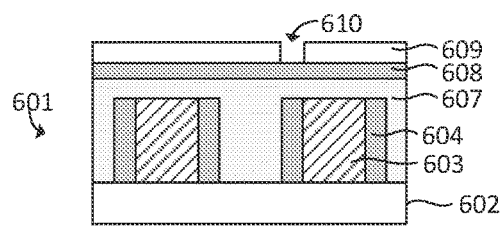

The method continues with operation 503, where a planarizing layer 607, a middle layer 608, and a layer of patterned photoresist 609 are sequentially provided on the substrate 601, as shown in FIG. 6B. In many cases, the planarizing layer 607 is spin-on-carbon or spin-on-glass, which are self-planarazing. Alternatively, the planarizing layer 607 may be deposited through chemical vapor deposition or other methods. The top surface/portion of the planarizing layer 607 is typically planar. The planarizing layer 607 may also be referred to as a mask or block mask. Various different conventional materials may be used for the middle layer 608, which may be deposited through spin-on techniques, PECVD techniques, etc. The photoresist 609 may be any type of photoresist. In a particular embodiment the photoresist 609 is extreme ultraviolet (EUV) photoresist. Such EUV photoresist may be exposed using the standard 13.5 nm EUV wavelength currently in use and development. However, other radiation sources may be used in some cases, including DUV (deep-UV), which generally refers to use of 248 nm or 193 nm excimer laser sources, X-ray, which formally includes EUV at the lower energy range of the X-ray range, as well as e-beam, which can cover a wide energy range.

The photoresist is deposited and then patterned to include opening 610 as part of operation 503. In this example, opening 610 is positioned above the third portion of the remaining first spacer layer 604, counting from the left. In other embodiments the opening 610 may be elsewhere. With this positioning, opening 610 will be used to remove the third portion of the remaining first spacer layer 604, thereby preventing formation of a first spacer feature 604' at this location, as described further below.

Notably, operations 502 and 503 occur while the cores 603 are still present on the substrate 601. This ensures that the cores 603 provide mechanical support to the remaining portions of the first spacer layer 604 during transfer and cleaning operations. In a more conventional process flow, the cores 603 would be removed (thereby forming first spacer features 604') immediately after the first spacer layer 604 is etched back (e.g., after operation 501), before the substrate is cleaned (e.g., before operation 502). After cleaning, the planarizing layer 607 would additionally be deposited in the locations where the cores 603 were removed. As a result of the conventional process flow, the first spacer features 604' would lack mechanical support during the various transfer and cleaning operations, leaving them vulnerable to tipping, as described in relation to FIG. 2D. By instead maintaining the cores 603 through substrate transfer, cleaning, and deposition of the planarizing layer 607, middle layer 608, and photoresist 609, the process flow of FIG. 5 ensures that the remaining portions of the first spacer layer 604 are adequately supported through the various processing steps, preventing them from tipping and causing further processing problems.

Figure 6G:
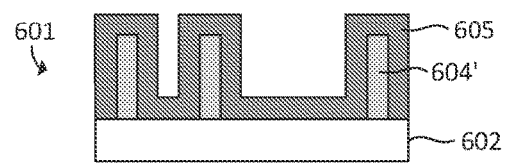
Figure 6C:
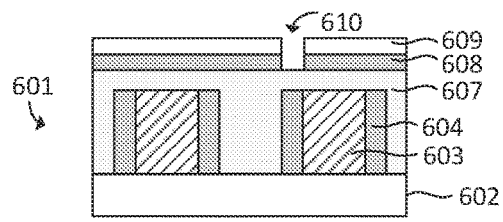

The method of FIG. 5 continues with operation 505, where the middle layer 608 is etched at the location of opening 610, as shown in FIG. 6C. The photoresist 609 acts as a mask, protecting the remaining portions of the middle layer 608. However, the photoresist 609 may be partially or completely removed as the middle layer 608 is etched in operation 505. The etching operation may involve exposing the substrate to chemistry and/or plasma configured to remove the material of the middle layer at opening 610. The etch process may be selective in that etches the material of the middle layer 608 to a greater degree than other materials such as the photoresist 609.

Figure 6H:
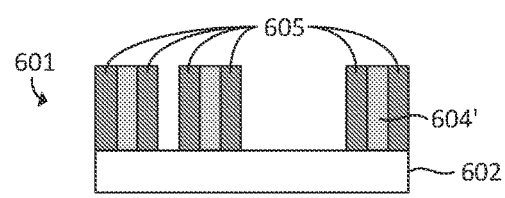
Figure 6D:
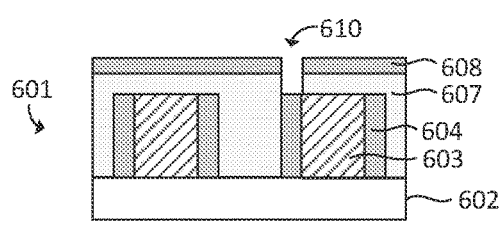

Next, the method continues with operation 507, where the planarizing layer 607 is etched at the location of opening 610, as shown in FIG. 6D. The middle layer 608 (as well as any remaining photoresist 609) acts as a mask while the planarizing layer 607 is being etched. As such, the middle layer 608 may also be referred to as a mask or mask layer. The planarizing layer 607 may be removed at opening 610 by exposing the substrate to chemistry and/or plasma configured to remove the planarizing layer 607. The etch process may be selective in that it etches the planarizing layer 607 to a greater degree than other materials such as middle layer 608. In one example, the substrate is exposed to an oxygen-containing plasma to remove planarizing layer 607 at opening 610. Some portion of the middle layer 608 may be removed during operation 507. At this point, the top portion of planarizing layer 607 is substantially planar (e.g., it is planar except for the opening 610).

Figure 6I:
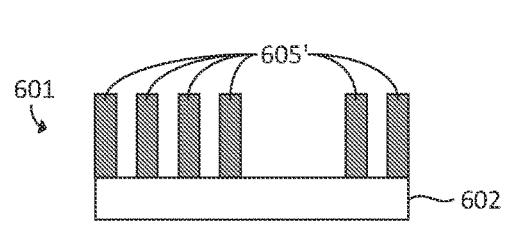
Figure 6E:
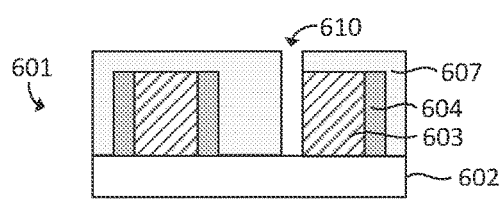

Then, at operation 509, a portion of the remaining first spacer layer 604 is removed at the location of opening 610, as shown in FIG. 6E. The middle layer 608 acts as a mask during this operation, and may be wholly or partially removed during this step. In various embodiments, the middle layer 608 is completely removed during operation 509. In such cases, the remaining planarizing layer 607 may act as a mask to protect the various features/structures on the substrate 601 at locations other than opening 610. The etch process may involve exposing the substrate to chemistry and/or plasma configured to remove the material of the first spacer layer 604 to a greater degree than other materials such as the middle layer 608 and/or planarizing layer 607.

At this point, the portion of the first spacer layer 604 corresponding to the location of opening 610 is completely removed. As such, the first spacer layer 604 will not form a first spacer feature 604' at this location. In order to remove the first spacer layer 604 at opening 610, the substrate may be exposed to chemistry and/or plasma configured to remove the material of the first spacer layer 604. In other words, the etch process is selective.

The method continues with operation 511, where the cores 603 and remaining planarizing layer 607 are removed, as shown in FIG. 6F. At this time, the remaining portions of the first spacer layer 604 are separate and distinct from one another, and may be referred to as first spacer features 604'. Typically, the cores 603 and planarizing layer 607 are removed through a dry process such as ashing. In one embodiment the cores 603 and planarizing layer 607 are removed together in a single step. In another embodiment, the cores 603 may be removed after the planarizing layer 607 is removed. In a conventional process flow, the cores 603 are already replaced by planarizing layer 607 by this point, and as such, only a single ashing step is used.

At this point, the substrate 601 of FIG. 6F is analogous to the substrate 501 of FIG. 4C. That is, the substrate 601 includes underlying material 602 and first spacer features 604'. The method continues with steps analogous to those described in FIGS. 3 and 4D-4F. At operation 513, a second spacer layer 605 is deposited over the first spacer features 604', as shown in FIG. 6G. At operation 515, the second spacer layer 605 is etched back, as shown in FIG. 6H. At operation 517, the first spacer features 604' are removed, as shown in FIG. 6I. At this time, the remaining portions of the second spacer layer 605 are separate and distinct from one another, and may be referred to as second spacer features 605'.

As shown in FIGS. 6A-6I, the process flow described in FIG. 5 tripled the number of features present on the substrate 601 (e.g., the substrate started with two features and ended with six features). Of course, any number of openings 610 can be used when practicing the method of FIG. 5, targeting features (e.g., first spacer features) for removal as desired for a particular application. Generally, the method of FIG. 5 may be used to increase the number of features on a substrate by a factor of 3:1 to 4:1, depending on the number of openings 610 provided in the photoresist 609. The layout of the resulting features can be controlled based on the positioning of the openings 610.

Figure 12A:
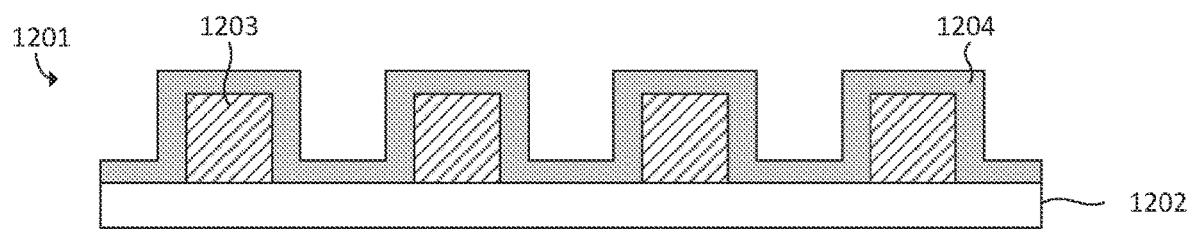
FIGS. 12A-12H depict a semiconductor substrate as it undergoes various processing steps in the method of FIG. 13.
Figure 12B:
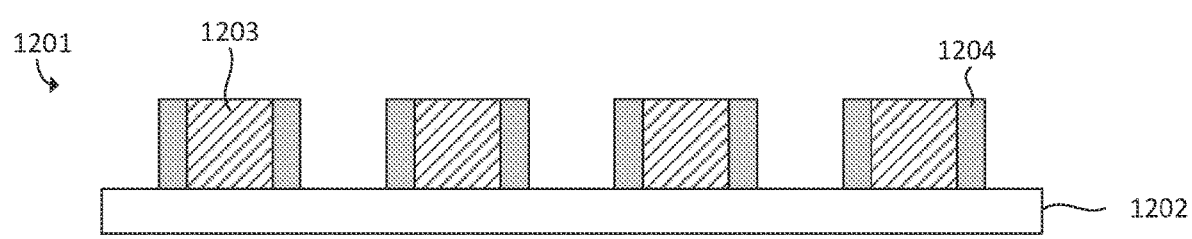
Figure 12C:
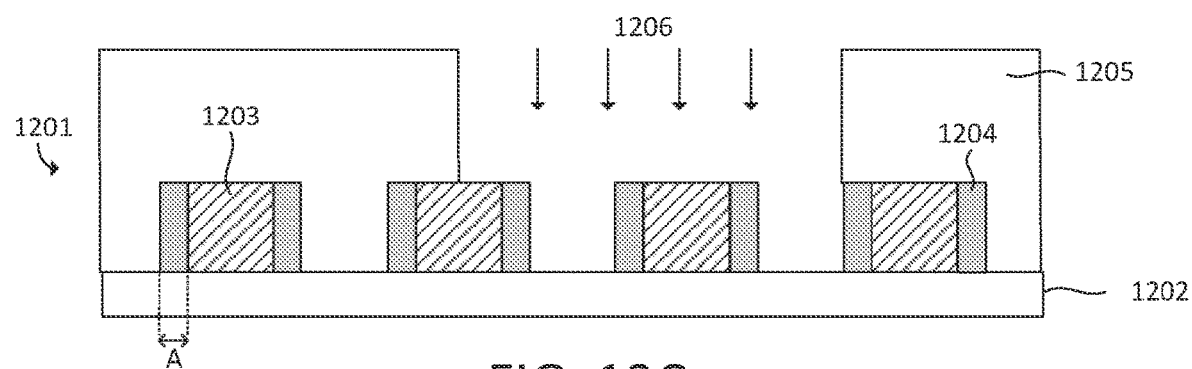
Figure 12D:
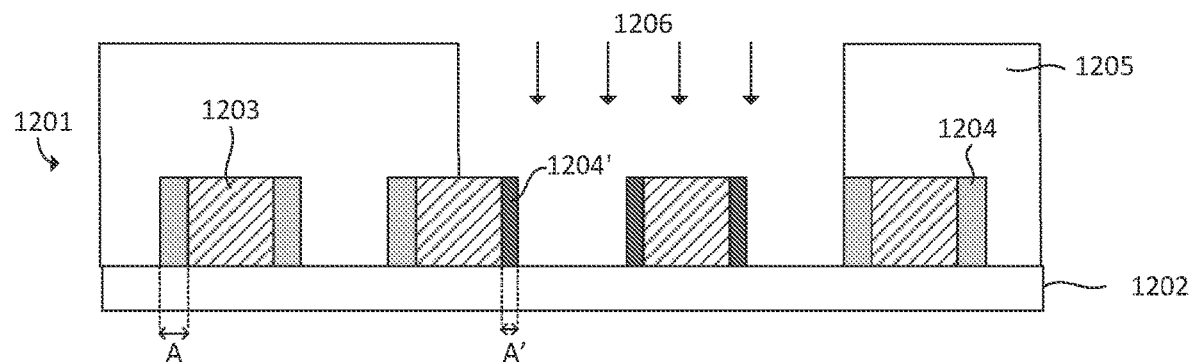
Figure 12E:
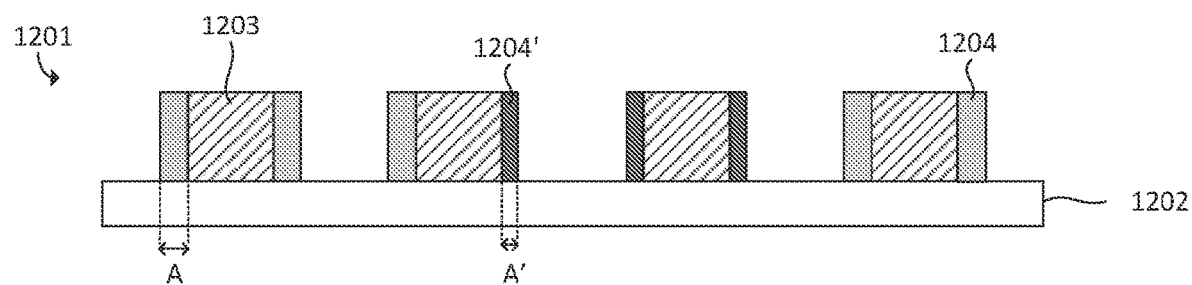
Figure 12F:
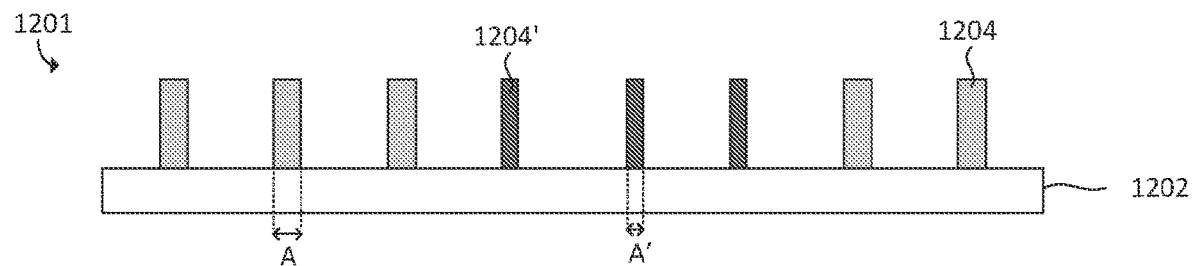
Figure 12G:
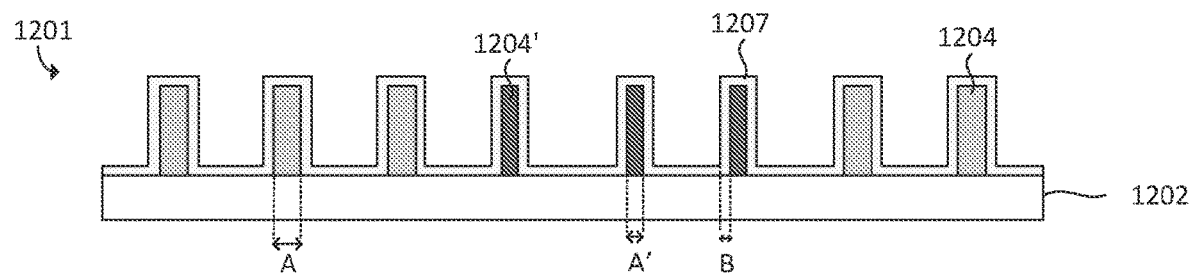
Figure 12H:
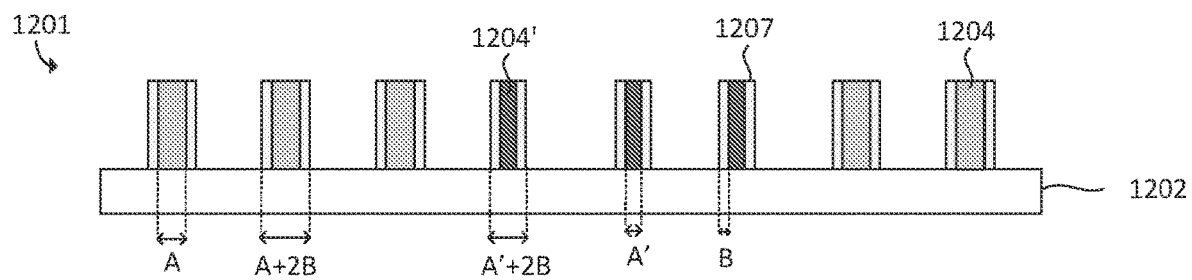
Figure 13:
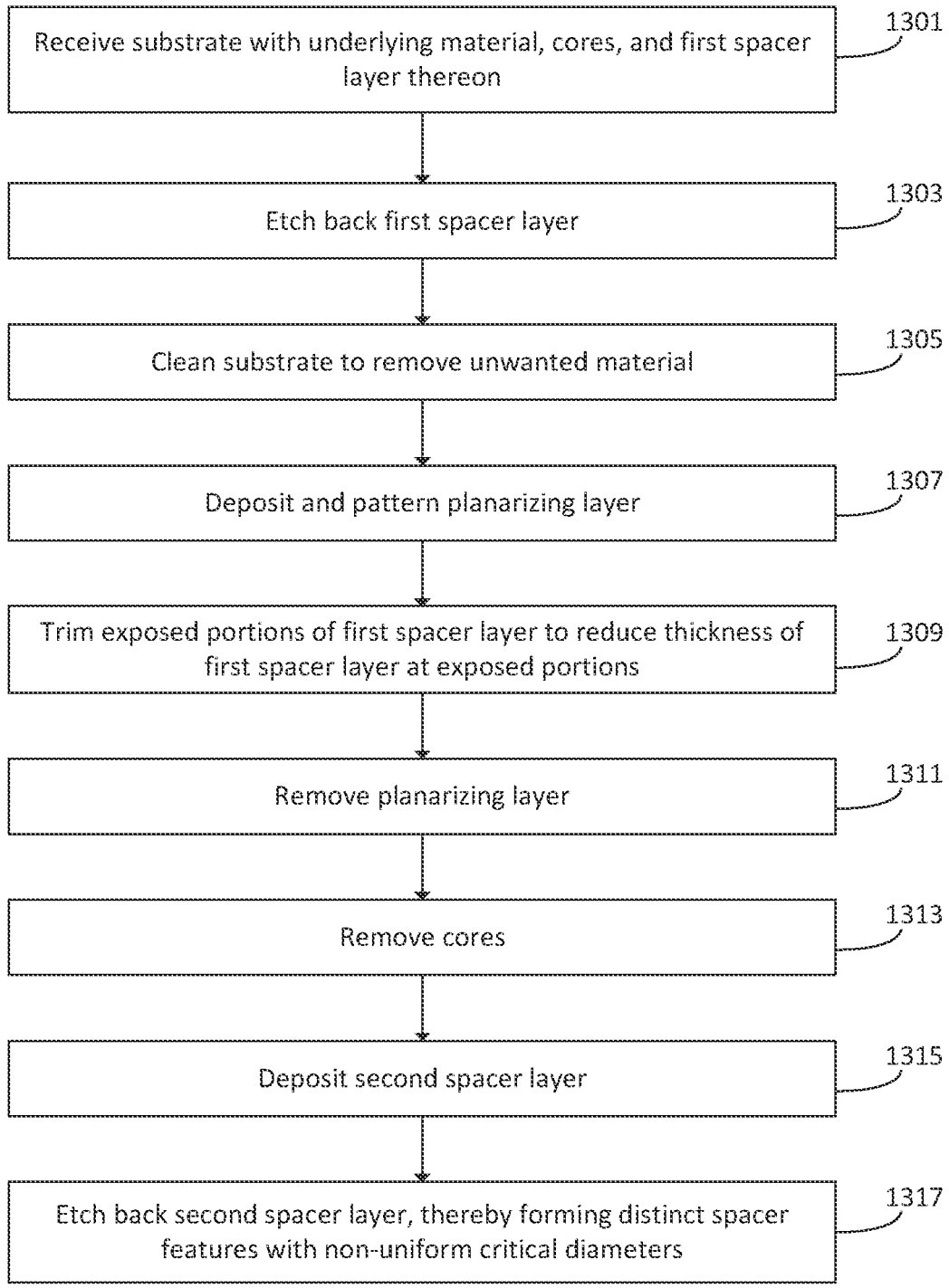
FIG. 13 is a flowchart describing a method of patterning that produces features having different critical dimensions.

FIG. 13 presents a flowchart describing a method of processing a semiconductor substrate, where the substrate is patterned to include features having non-uniform critical dimensions. Like the methods described in FIG. 3 and FIG. 5, the method of FIG. 13 ensures that the cores are maintained on the substrate through several processing steps, allowing the cores to provide mechanical support to adjacent structures, and thereby preventing such structures from collapsing. FIGS. 12A-12H depict a partially fabricated semiconductor substrate as it undergoes the method of FIG. 13. These figures will be described together for the sake of clarity.

The method of FIG. 13 begins at operation 1301, where a substrate 1201 is received in a reaction chamber. The substrate 1201 may be positioned on a substrate support, for example. The substrate 1201 includes underlying material 1202, cores 1203, and a first spacer layer 1204, as shown in FIG. 12A. Next, at operation 1303, the first spacer layer 1204 is etched back, as shown in FIG. 12B. This operation is analogous to the etch back of the first spacer layer in operation 303 of FIG. 3, for example. At operation 1305, the substrate is subjected to cleaning to remove unwanted material, which may be generated during etch back of the first spacer layer in operation 1303, for example. Next, at operation 1307 a planarizing layer 1205 is deposited and patterned, as shown in FIG. 12C. The planarizing layer 1205 is analogous to the planarizing layer 607 of FIGS. 6B-6E, and may be patterned through similar techniques (e.g., one or more additional layers may be used in combination with lithography).

The planarizing layer 1205 is patterned to expose specific portions of the underlying structures, as shown in FIG. 12C. In particular, the planarizing layer 1205 is patterned to define exposed regions (e.g., where the planarizing layer 1205 has been removed) and protected regions (e.g., where the planarizing layer remains) on the substrate. As explained further below, this allows the formation of features with non-uniform critical dimensions.

At operation 1309, the exposed portions of the first spacer layer 1204 are trimmed through exposure to ions, chemicals, and/or plasma 1206 to reduce the thickness of the first spacer layer 1204 in the exposed regions. FIG. 12C depicts the substrate 1201 at the beginning of this trimming operation 1309, and FIG. 12D depicts the substrate 1201 at the end of this trimming operation 1309. Prior to trimming, the first spacer layer 1204 has thickness A at all regions where the first spacer layer 1204 remains. The thickness is measured in a direction parallel to the substrate surface. After trimming, the first spacer layer 1204 has thickness A in the protected regions, and a narrower thickness A' in the exposed regions. At this point, these narrowed features may be referred to as trimmed first spacers 1204'. While FIGS. 12D-12H depict three adjacent trimmed first spacers 1204', it is understood that any number of trimmed first spacers 1204' may be used, and they may be formed in any desired layout for a particular application.

Next, at operation 1311, the planarizing layer 1205 is removed, as shown in FIG. 12E. This step is analogous to removal of the planarizing layer in operation 511 of FIG. 5. At operation 1313, the cores 1203 are removed, as shown in FIG. 12F. This step is analogous to removal of the cores in operation 511 of FIG. 5. In some cases, the planarizing layer 1205 and the cores 1203 may be removed in separate steps, while in other cases these may be removed together in a single step. After the cores 1203 are removed, the features formed from the remaining untrimmed portions of the first spacer layer 1204, as well as the features formed from the trimmed first spacers 1204' are separate and distinct from one another, and may be referred to as first spacer features.

FIG. 12F clearly depicts the non-uniform critical dimensions of the first spacer features. In particular, the first spacer features formed from the first spacer layer 1204 not subject to trimming (shown in lighter gray) have thickness A, while the first spacer features formed from the trimmed first spacers 1204' (shown in darker gray) have a narrower thickness A'.

At operation 1315, the second spacer layer 1207 is deposited, as shown in FIG. 12G. The second spacer layer 1207 has thickness B. This deposition is analogous to deposition of the second spacer layer in operation 313 of FIG. 3 and operation 513 of FIG. 5. Next, at operation 1317, the second spacer layer 1207 is etched back, as shown in FIG. 12H. This etchback is analogous to operation 315 of FIG. 3 and operation 515 of FIG. 5. The substrate 1201 shown in FIG. 12H has two different types of features thereon, with different critical dimensions. One type of feature has thickness A+2B, and is formed in regions where the planarizing layer 1205 was present to protect the underlying structures during the trimming in operation 1309. The other type of feature is narrower, with thickness A'+2B, and is formed in regions where the planarizing layer 1205 was removed to expose the underlying structures, and where portions of the first spacer layer 1204 were trimmed to form trimmed first spacers 1204'.

In certain embodiments, operations 1315 and 1317 may be omitted. Even without deposition of the second spacer layer 1207, features having different critical dimensions can be formed, for example as shown in FIG. 12F. In some embodiments, additional operations may take place. As one example, the material from the first spacer layer 1204 and the trimmed first spacers 1204' may be removed after operation 1317. This would produce features having uniform thickness B, but different spacing between adjacent sets of features. For instance, some sets of adjacent features will be separated by distance A, while other sets of adjacent features will be separated by distance A'.

One notable characteristic about the method shown in FIG. 13 and FIGS. 12A-12H is that the cores 1203 remain on the substrate 1201 through several processing steps including etching back the first spacer layer 1204 in operation 1303, cleaning the substrate 1201 in operation 1305, depositing and patterning the planarizing layer 1205 in operation 1307, and trimming the exposed portions of the first spacer layer 1204 to form trimmed first spacers 1204' in operation 1309. Further, many of the processing steps outlined in FIG. 13 may be done in the reaction chamber used to deposit the second spacer layer 1207. For instance, at least the steps of trimming the first spacer layer 1204 in operation 1309, removing the planarizing layer 1205 in operation 1311, removing the cores 1203 in operation 1313, and depositing the second spacer layer 1207 in operation 1315 may all be done in this reaction chamber. By ensuring that the cores 1203 remain on the substrate 1201 until after the substrate 1201 is transferred to the reaction chamber used to deposit the second spacer layer 1207, the risk of feature collapse is substantially reduced or eliminated. This risk is reduced because the substrate is not subjected to transfer, cleaning, or other operations likely to cause collapse while the relevant features lack adequate support.

Various kinds of feedback may be used when practicing the embodiments herein. For example, when removing the cores (e.g., in operations 311, 511, or 1313) feedback may be used to determine the time at which the core material is sufficiently removed from the substrate. The time it takes for this to occur may change from day to day or even substrate to substrate, based on a variety of factors. Example feedback methods that may be used to monitor the core removal process include optical emission spectroscopy (OES) and laser interferometry (LSR). Real time feedback is useful in this context because it allows the core removal process to be stopped right after the cores are sufficiently removed, thus minimizing excess plasma exposure (and/or other harsh processing conditions) on the substrate, and particularly on the first spacer features. In many embodiments, the core removal process involves exposing the substrate to plasma (e.g., an oxygen-containing plasma), sometimes referred to as an ashing plasma. The core removal process may be stopped by simply extinguishing the plasma. The core removal process may be stopped in response to feedback from OES and/or LSR equipment indicating that the core removal process is complete or substantially complete.

In this context, optical emission spectroscopy involves monitoring the optical emission of the plasma exposed to the substrate to remove the cores. As the cores react with the plasma, the core material reacts away, forming gas phase products that are removed from the chamber through a vacuum connection. The optical emission spectrum is monitored to detect the presence and relative concentration of the gas phase products. The gas phase products typically increase in concentration (and measured line intensity at a particular wavelength) near the beginning of the removal process, then reach a steady state, and then drop off once the removal process is nearing completion. Once the measured intensity for a particular gas phase product falls to a threshold level, it means that the core material is removed and further exposure of the substrate to plasma is unnecessary (and potentially harmful). In one example, the cores are carbon or a carbon-based material, and removing the cores involves ashing the carbon to form gas phase carbon dioxide. The optical emission spectrum of the plasma is monitored at the wavelength at which carbon dioxide emits. Initially, the carbon dioxide signal rises as the carbon of the core is reacted away to form carbon dioxide. The carbon dioxide signal reaches a steady state, at which point the carbon dioxide is being produced at the same rate at which it is being removed from the chamber. Finally, the carbon dioxide signal begins to decrease toward 0, indicating that the carbon dioxide is being removed from the chamber faster than it is being produced, meaning that the removal process is complete or nearing completion. Similar techniques may be used with other types of core materials and ashing plasmas.

As mentioned above, another kind of feedback that may be used to detect the end point of the core removal process involves laser interferometry. In this context, laser interferometry involves shining one or more laser onto the substrate (splitting the laser into two or more beams if a single laser is used), bouncing the beams off the substrate, and monitoring the interference pattern that is returned from the substrate. This technique examines photon-matter interaction on the wafer surface, and can be used to detect when the core removal process is complete.

Another kind of feedback that may be used in any of the embodiments herein relates to optical critical dimension metrology (OCD), often referred to as scatterometry. This type of feedback may be used to measure the width (e.g., left-to-right width in FIG. 4C or 6F) of the first spacer features after the cores have been removed. In various embodiments, the chamber used to remove the cores and deposit the second spacer layer may include scatterometry hardware for performing OCD. In this way, the width of the first spacer features can be measured in-situ in the deposition chamber, without transferring the substrate to another chamber for metrology. Such substrate transfer could undesirably cause the first spacer features to tip over, as described in relation to FIG. 2D, for example. Instead, the cores can be removed, the width of the first spacer features can be measured, and then the second spacer layer can be deposited all without dechucking or otherwise disturbing the substrate. The width(s) measured by the scatterometry hardware may be used as feedback for controlling an upstream process, such as deposition of the first spacer layer. If the scatterometry indicates that the first spacer features are narrower than desired, the process for forming the first spacer features may increase in duration in order to form a thicker first spacer layer on future-processed substrates. Likewise, if the scatterometry indicates that the first spacer features are wider than desired, the process for forming the first spacer features may decrease in duration in order to form a thinner first spacer layer on future-processed substrates. Alternatively or in addition to changes in duration, the deposition of the first spacer layer may also be modified based on the scatterometry results to use different plasma conditions, if desired. These changes may be made based on automatic process control, or the changes may be made manually.

In order to obtain the feedback described herein, the deposition chamber used to deposit the second spacer layer may be modified to include relevant feedback hardware. For example, the deposition chamber may be modified to include optical emission spectroscopy hardware, laser interferometry hardware, and/or optical CD metrology/scatterometry hardware. Conventional deposition chambers used to deposit the second spacer layer do not include such feedback hardware. Frequently, the second spacer layer is deposited through atomic layer deposition (which may be driven through plasma energy and/or thermal energy), which deposits very slowly and predictably. Due to the predictable and controllable nature of atomic layer deposition reactions, there is no need to actively monitor the deposition process. Rather, the end point of the deposition reaction can be reliably predicted based solely on deposition rate and desired film thickness. As such, conventional chambers for depositing the second spacer layer do not include hardware for endpoint detection. The same holds true for other types of deposition chambers with predictable deposition rates (e.g., chemical vapor deposition chambers, etc.). Similarly, conventional chambers for depositing the second spacer layer do not include scatterometry hardware. Such hardware may be used in other tools earlier in the process flow. However, there has not previously been a compelling reason to include such hardware in the deposition chamber used for depositing the second spacer layer.

Apparatus

Figure 7:
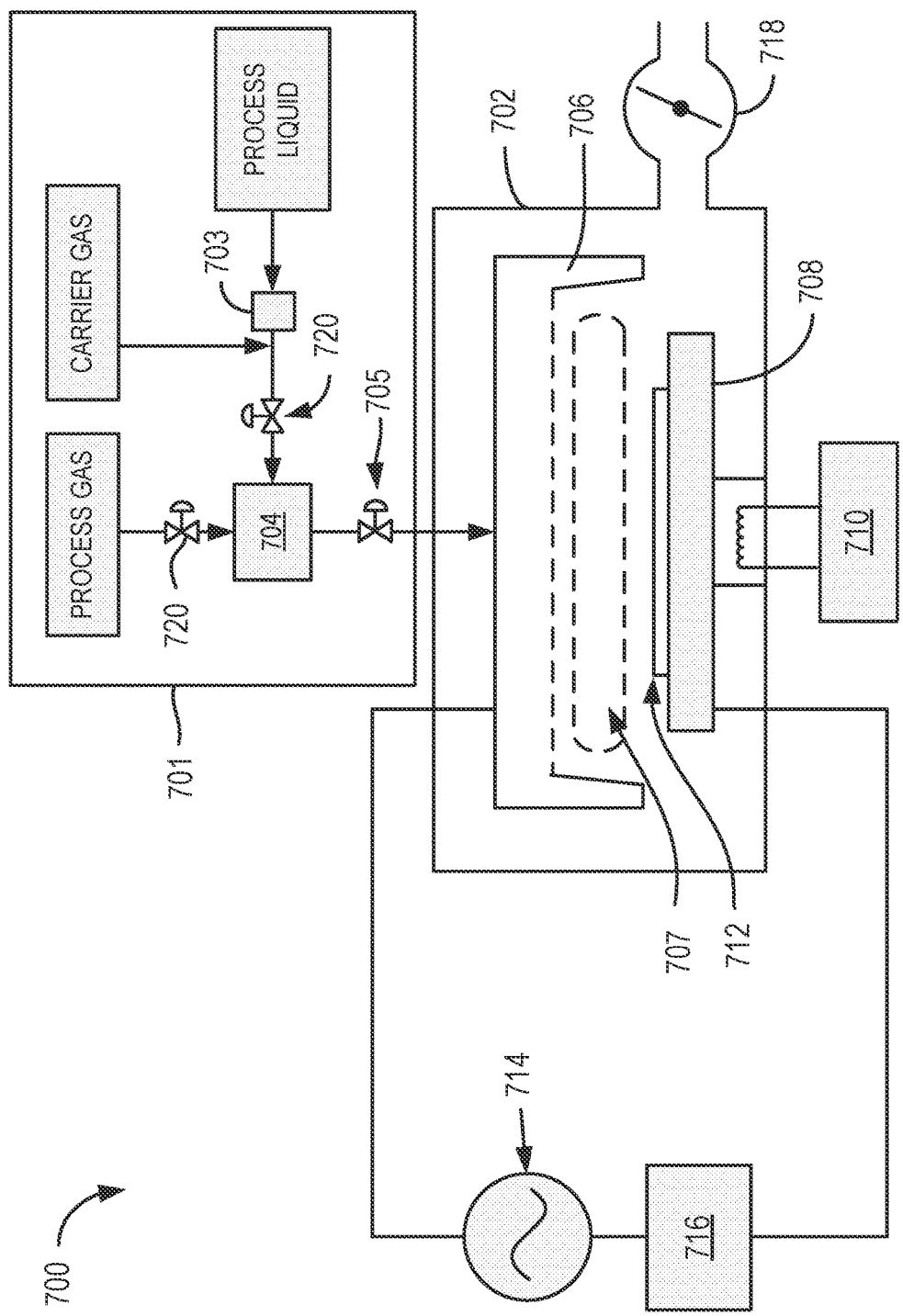
FIG. 7 presents a reaction chamber that may be used to perform various steps in the methods described herein.

FIG. 7 schematically shows an embodiment of a process station 700 that may be used to process a substrate according to various embodiments. For instance, the process station 700 may be used to perform many of the operations described herein, including removing the cores (e.g., in operations 311, 511, and 1313), removing additional planarizing layer (e.g., in operations 511 and 1311), depositing the second spacer layer (e.g., in operations 313, 513, and 1315), and performing any metrology and feedback techniques relevant to these processes. The benefits described above may be achieved by performing these operations in the same process station 700 using the process flows described in FIGS. 3, 5, and/or 13. For example, removing the cores (and additional planarizing layer, if present) and depositing the second spacer layer in the same station eliminates the need to transfer the substrate while the first spacer features are in a mechanically compromised state. In various embodiments, the substrate is not transferred at a time when the first spacer features are laterally unsupported, as shown in FIGS. 2C, 4C, 6F, and 12F. In other words, after the first spacer layer is etched back as shown in FIGS. 2B, 4B, 6A, and 12B, the substrate is only transferred when the remaining portions of the first spacer layer (or first spacer features) are laterally supported, e.g., by the material of the cores or the material of the second spacer layer.

In some embodiments, certain additional operations described herein may occur in process station 700 (e.g., in the same process station 700 used to remove the cores and deposit the second spacer layer). For example, in some embodiments process station 700 may also be used to deposit the first spacer layer. In these or other embodiments, process station 700 may be used to laterally trim the cores prior to deposition of the first spacer layer. This trimming ensures uniformity in the critical dimension of the cores across the surface of the substrate (and between different substrates). In these or other embodiments, process station 700 may be used to plasma treat (e.g., with He and/or Ar plasma) the substrate to thereby activate the surface of the substrate for improved conformality and adhesion of a film (e.g., a first or second spacer layer or other layer described herein) prior to deposition.

For simplicity, the process station 700 is depicted as a standalone process station having a process chamber body 702 for maintaining a low-pressure environment. However, it will be appreciated that a plurality of process stations 700 may be included in a common process tool environment. Further, it will be appreciated that, in some embodiments, one or more hardware parameters of process station 700, including those discussed in detail below, may be adjusted programmatically by one or more computer controllers.

Process station 700 fluidly communicates with reactant delivery system 701 for delivering process gases to a distribution showerhead 706. Reactant delivery system 701 includes a mixing vessel 704 for blending and/or conditioning process gases for delivery to showerhead 706. One or more mixing vessel inlet valves 720 may control introduction of process gases to mixing vessel 704. Similarly, a showerhead inlet valve 705 may control introduction of process gasses to the showerhead 706.

Some reactants, like BTBAS, may be stored in liquid form prior to vaporization at and subsequent delivery to the process station. For example, the embodiment of FIG. 7 includes a vaporization point 703 for vaporizing liquid reactant to be supplied to mixing vessel 704. In some embodiments, vaporization point 703 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 704.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller upstream of vaporization point 703 may be provided for controlling a mass flow of liquid for vaporization and delivery to process station 700. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 706 distributes process gases toward substrate 712. In the embodiment shown in FIG. 7, substrate 712 is located beneath showerhead 706, and is shown resting on a pedestal 708. It will be appreciated that showerhead 706 may have any suitable shape, and may have any suitable number and arrangement of ports for distributing processes gases to substrate 712.

In some embodiments, a microvolume 707 is located beneath showerhead 706. Performing a process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. For instance, when such a microvolume is used for an atomic layer deposition process, the deposition rate per cycle is lower than it would be for a larger volume, but the cycle time is also simultaneously reduced. In certain cases, the effect of the latter is dramatic enough to improve overall throughput of the module for a given target thickness of film.

In some embodiments, pedestal 708 may be raised or lowered to expose substrate 712 to microvolume 707 and/or to vary a volume of microvolume 707. For example, in a substrate transfer phase, pedestal 708 may be lowered to allow substrate 712 to be loaded onto pedestal 708. During a substrate processing phase (e.g., to deposit a material on the substrate, etch a material on the substrate, or treat a material on the substrate, etc.), pedestal 708 may be raised to position substrate 712 within microvolume 707. In some embodiments, microvolume 707 may completely enclose substrate 712 as well as a portion of pedestal 708 to create a region of high flow impedance while processing the substrate.

Optionally, pedestal 708 may be lowered and/or raised while the substrate is being processed to modulate process pressure, reactant concentration, etc., within microvolume 707. In one scenario where process chamber body 702 remains at a base pressure while processing the substrate, lowering pedestal 708 may allow microvolume 707 to be evacuated. Example ratios of microvolume to process chamber volume include, but are not limited to, volume ratios between 1:700 and 1:10. It will be appreciated that, in some embodiments, pedestal height may be adjusted programmatically by a suitable computer controller.

In another scenario, adjusting a height of pedestal 708 may allow a plasma density to be varied during plasma activation and/or treatment cycles included in the process. At the conclusion of the substrate processing phase, pedestal 708 may be lowered during another substrate transfer phase to allow removal of substrate 712 from pedestal 708.

While the example microvolume variations described herein refer to a height-adjustable pedestal, it will be appreciated that, in some embodiments, a position of showerhead 706 may be adjusted relative to pedestal 708 to vary a volume of microvolume 707. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers.

Returning to the embodiment shown in FIG. 7, showerhead 706 and pedestal 708 electrically communicate with RF power supply 714 and matching network 716 for powering a plasma. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are included above. Likewise, RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 50 kHz and 700 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. As mentioned above, OES hardware may be used to determine the end point of the reaction used to remove the cores. Alternatively or in addition, laser interferometry hardware may be used to determine the end point of this reaction. In these or other embodiments, OCD/scatterometry hardware may be used to measure the width of the first spacer features and/or other features present on the substrate surface. It will be appreciated that, in some embodiments, other monitors may be used to monitor the plasma, substrate, and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a process recipe. In some cases, process recipe phases may be sequentially arranged, so that all instructions for a particular process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 708 may be temperature controlled via heater 710. Further, in some embodiments, pressure control for deposition process station 700 may be provided by butterfly valve 718. As shown in the embodiment of FIG. 7, butterfly valve 718 throttles a vacuum provided by a downstream vacuum pump (not shown). However, in some embodiments, pressure control of process station 700 may also be adjusted by varying a flow rate of one or more gases introduced to process station 700.

Figure 8:
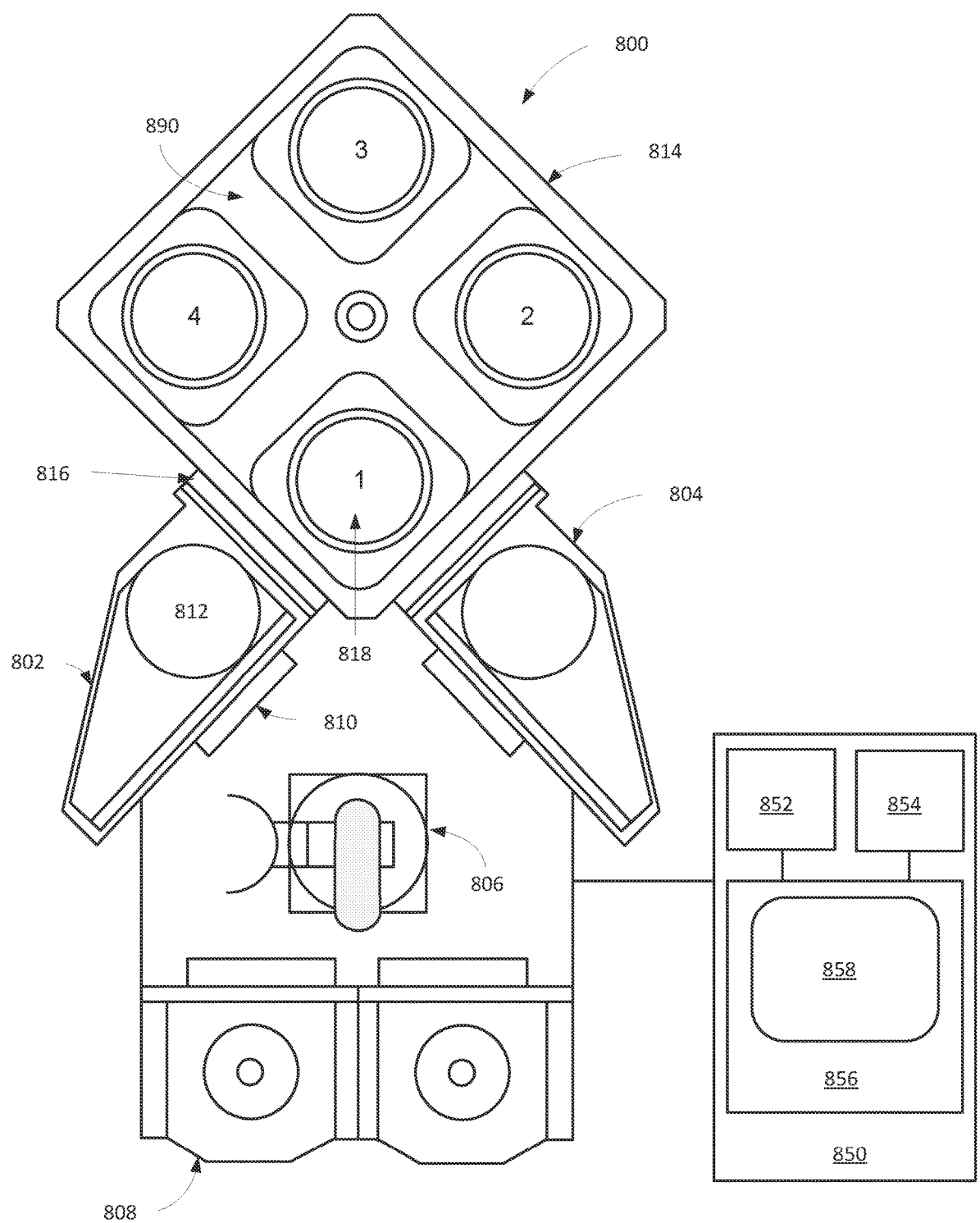
FIG. 8 depicts a multi-station processing tool that may be used to perform various steps in the methods described herein.

FIG. 8 shows a schematic view of an embodiment of a multi-station processing tool 800 according to certain embodiments. The multi-station processing tool 800 may be used to perform many of the operations described herein, including removing the cores (e.g., in operations 311, 511, and 1313), removing additional planarizing layer (e.g., in operations 511 and 1311), depositing the second spacer layer (e.g., in operations 313, 513, and 1315), and performing any metrology and feedback techniques relevant to these processes. The benefits described above may be achieved by performing these operations in the same multi-station processing tool 800 using the process flows described in FIGS. 3, 5, and/or 13. For example, removing the cores (and additional planarizing layer, if present) and depositing the second spacer layer in the same multi-station processing tool eliminates the need to transfer the substrate between tools while the first spacer features are in a mechanically compromised state. In various cases, these operations are performed in the same station of the multi-station processing tool 800, as described above in relation to FIG. 7.

In some embodiments, certain additional operations described herein may occur in multi-station tool 800 (e.g., in the same multi-station processing tool 800 used to remove the cores and deposit the second spacer layer, for example within the same station of the multi-station processing tool 800). For example, in some embodiments multi-station processing tool 800 may also be used to deposit the first spacer layer.

The multi-station processing tool 800 includes an inbound load lock 802 and an outbound load lock 804, either or both of which may comprise a remote plasma source. A robot 806, at atmospheric pressure, is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 comprises a remote plasma source, the wafer may be exposed to a remote plasma treatment in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 comprises four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. While the depicted processing chamber 814 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 also depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. System control software 858 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 800. System control software 858 may be configured in any suitable way. For example, various process tool component subroutines or control objects may be written to control operation of the process tool components necessary to carry out various process tool processes in accordance with the disclosed methods. System control software 858 may be coded in any suitable computer readable programming language.

In some embodiments, system control software 858 may include input/output control (IOC) sequencing instructions for controlling the various parameters described above. For example, each phase of a plasma enhanced atomic layer deposition (PEALD) process may include one or more instructions for execution by system controller 850. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase. Similar recipe phases may be used for other types of processing, as well.

Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition and flow rates and optionally for flowing gas into one or more process stations prior to deposition or other processing in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, optical emission sensors (e.g., for performing OES), laser interferometry sensors (e.g., for performing LSR), optical CD metrology/scatterometry sensors (e.g., for performing scatterometry), etc. Appropriately programmed feedback and control algorithms may be used with data from these sensors to maintain process conditions and control various processes.

Any suitable chamber may be used to implement the disclosed embodiments. Example apparatuses include, but are not limited to, apparatus from the STRIKER® product family, the ALTUS® product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method or combination of functions/methods as desired. Any of the operations described herein as occurring in the same chamber may be performed in the same station of a multi-station tool, such that there is no need to transfer the substrate between different stations for different operations.

Figure 9:
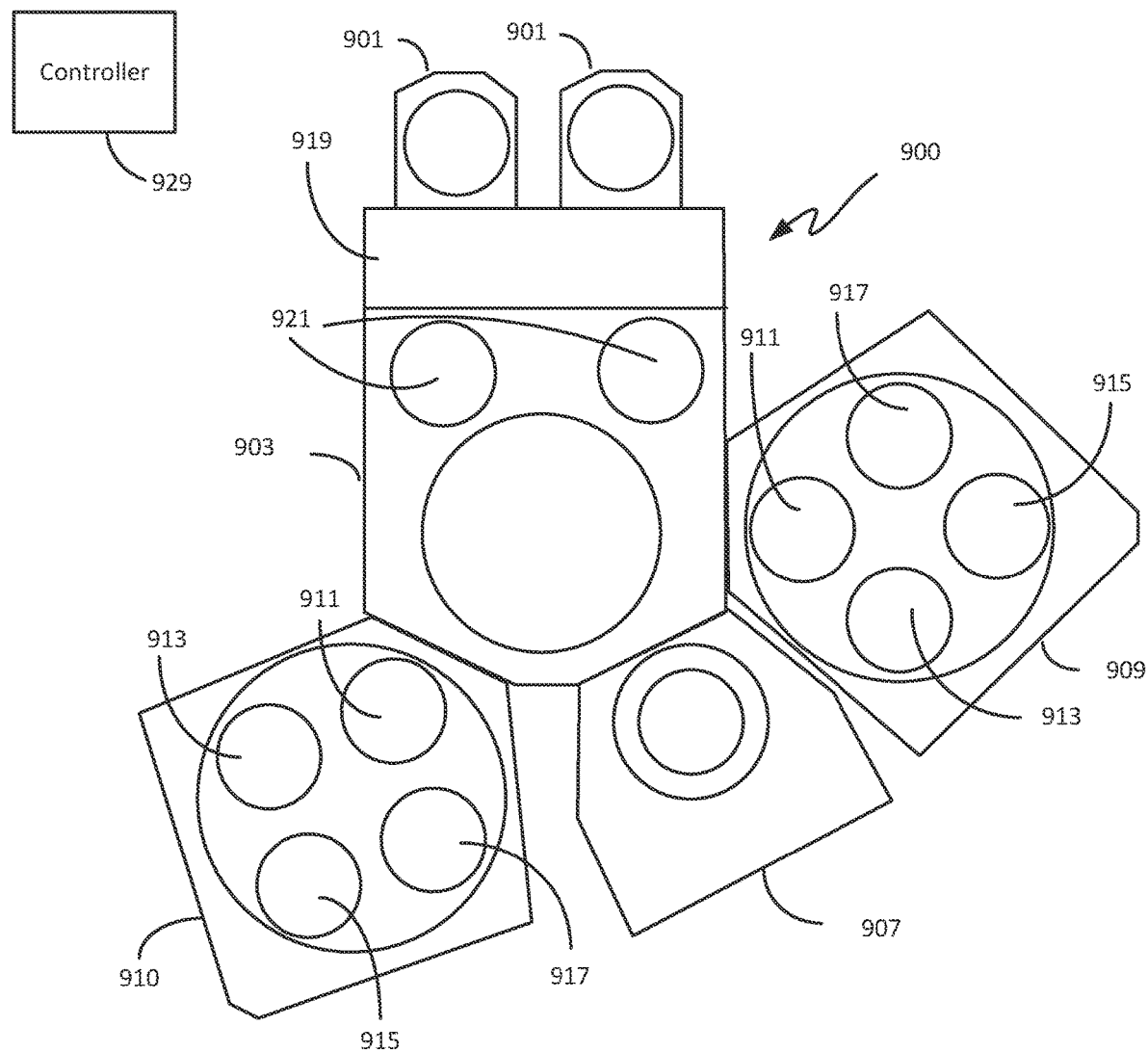
FIG. 9 shows a processing system that may be used to perform various steps in the methods described herein.

FIG. 9 is a block diagram of a processing system suitable for conducting thin film deposition processes, etch processes, cleaning processes, and other processes in accordance with certain embodiments. The system 900 includes a transfer module 903. The transfer module 903 provides a clean, pressurized environment to minimize risk of contamination of substrates being processed as they are moved between various reactor modules. Mounted on the transfer module 903 are two multi-station reactors 909 and 910, each capable of performing atomic layer deposition (ALD), chemical vapor deposition (CVD), core removal, and other processes described herein according to certain embodiments. Reactors 909 and 910 may include multiple stations 911, 913, 915, and 917 that may sequentially or non-sequentially perform operations in accordance with disclosed embodiments. The stations 911, 913, 915, and 917 may include a heated pedestal or substrate support, and one or more gas inlets or showerhead or dispersion plate. As mentioned above, any of the operations described herein as occurring in the same chamber may be performed in the same station of a multi-station chamber, such that there is no need to transfer the substrate between different stations for different operations.

Also mounted on the transfer module 903 may be one or more single or multi-station modules 907 capable of performing plasma or chemical (non-plasma) cleaning, etching, deposition, or any other processes described in relation to the disclosed methods. The module 907 may in some cases be used for various treatments to, for example, prepare a substrate for a deposition process. The module 907 may also be designed/configured to perform various other processes such as etching or polishing. The system 900 also includes one or more wafer source modules 901, where wafers are stored before and after processing. An atmospheric robot (not shown) in the atmospheric transfer chamber 919 may first remove wafers from the source modules 901 to loadlocks 921. A wafer transfer device (generally a robot arm unit) in the transfer module 903 moves the wafers from loadlocks 921 to and among the modules mounted on the transfer module 903.

In various embodiments, a system controller 929 is employed to control process conditions during processing. The controller 929 will typically include one or more memory devices and one or more processors. A processor may include a CPU or computer, analog and/or digital input/output connections, stepper motor controller boards, etc.

The controller 929 may control all of the activities of the apparatus. The system controller 929 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 929 may be employed in some embodiments.

Typically there will be a user interface associated with the controller 929. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 929. The signals for controlling the process are output on the analog and digital output connections of the deposition apparatus 900.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 929 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 929, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. In various embodiments herein, one module may be configured to perform various processes associated with the process flows in FIGS. 3, 5, and/or 13, as described further above, such that there is no need to transfer the substrate while the substrate has structures thereon that are vulnerable to collapse.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EXPERIMENTAL

Experimental results have shown that the disclosed methods may be used to minimize defects such as those related to the first spacer features tipping over before the second spacer layer is deposited. FIGS. 10A-C and 11A-C illustrate some of these results. FIGS. 10A-C and 11A-C are drawings characterizing SEMs resulting from actual experiments.

Figure 10A:
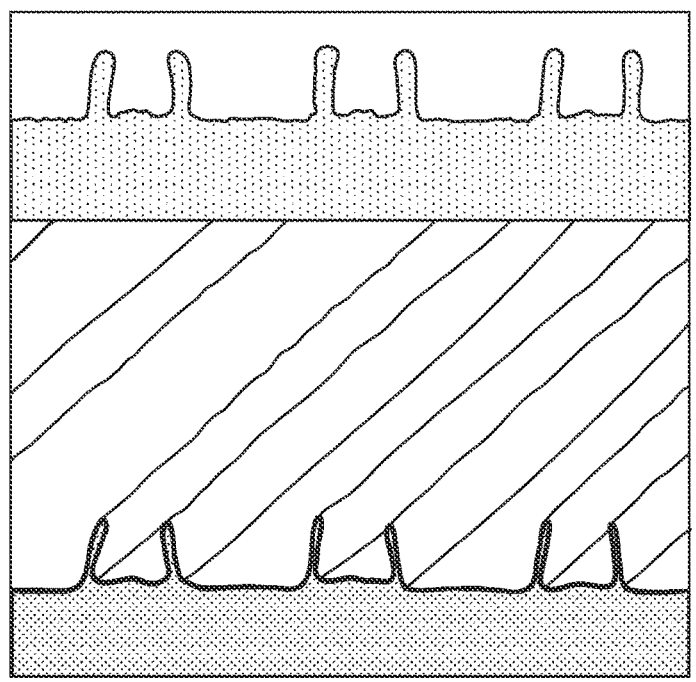
FIGS. 10A-10C show experimental results related to the processing scheme described in FIG. 1 and FIGS. 2A-2E.

FIG. 10A illustrates first spacer features fabricated according to the method of FIG. 1. Specifically, FIG. 10A shows the first spacer features after operation 109 of FIG. 1 (e.g., after performing a wet clean on the substrate to remove unwanted material generated during the etch back of the first spacer layer). As shown in FIG. 10A, the first spacer features are not vertical. Rather, pairs of neighboring first spacer features tilt inward toward one another. This tilting is not desirable.

Figure 10B:
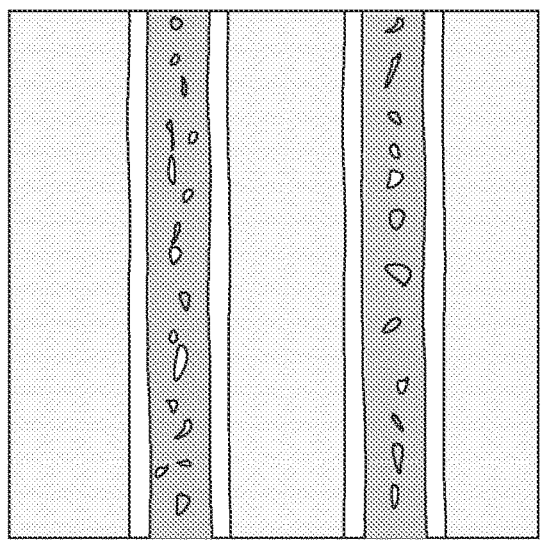
Figure 10C:
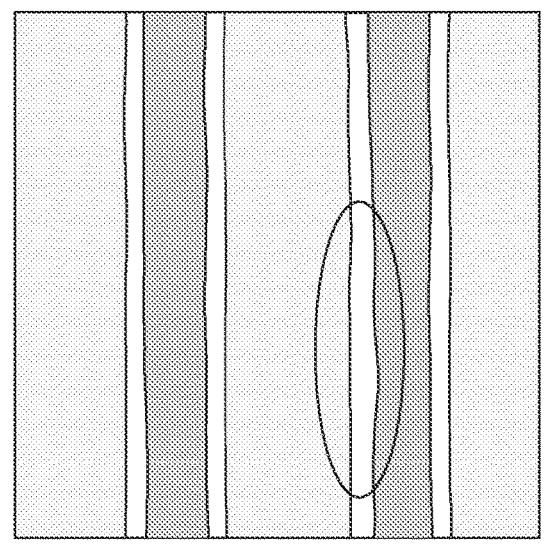

FIGS. 10B and 10C illustrate top-down views of the substrate shown in FIG. 10A. FIG. 10B shows the substrate after operation 103 of FIG. 1 (e.g., after the first spacer layer is etched back and before the cores are removed), while FIG. 10C shows the substrate after operation 109 (e.g., after the cores are removed and the substrate is cleaned). The circled portion of FIG. 10C shows an area where the first spacer features (shown as white lines) exhibit bending/tipping. The bending/tipping is visible based on the non-uniform thickness of the dark gray line between adjacent sets of first spacer features. These results clearly illustrate the tipping problem described herein.

Figure 11A:
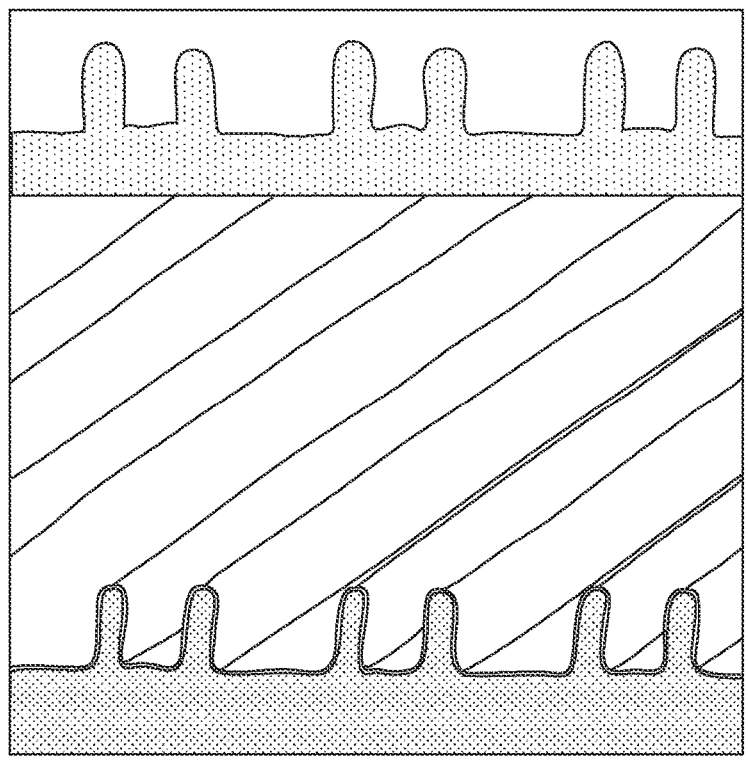
FIGS. 11A-11C show experimental results related to the processing scheme described in FIGS. 3 and 4A-4F.

By contrast, FIG. 11A shows first spacer features covered with the second spacer layer, fabricated according to the method of FIG. 3. Specifically, FIG. 11A shows the first spacer features/second spacer layer after operation 313 of FIG. 3 (e.g., after the second spacer is deposited). The first spacer features and second spacer layer form neighboring pairs of lines that are vertical. The neighboring pairs of lines do not tilt inward toward one another, representing a substantial improvement over the results of FIG. 10A.

Figure 11B:
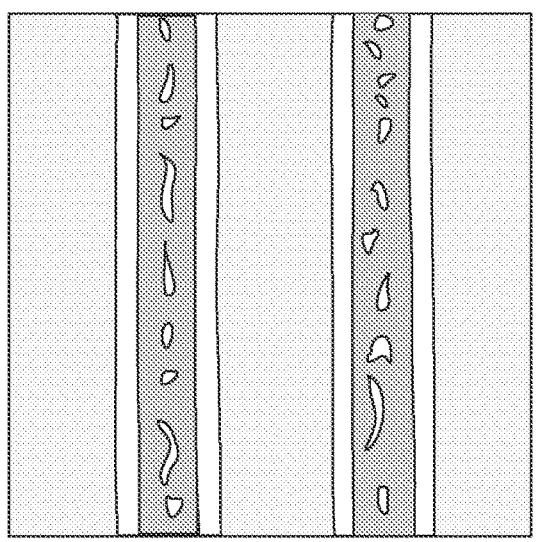
Figure 11C:
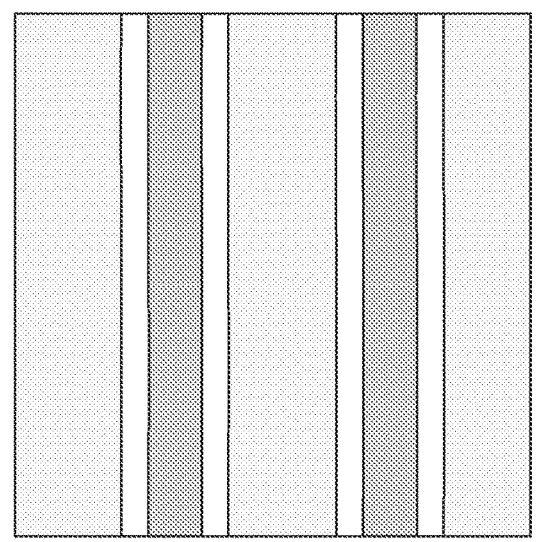

FIGS. 11B and 11C illustrate top-down views of the substrate shown in FIG. 11A. FIG. 11B shows the substrate after operation 303 of FIG. 3 (e.g., after the first spacer layer is etched back), while FIG. 11C shows the substrate after operation 313 (e.g., after the second spacer layer is deposited). As compared to the lines shown in FIG. 10C, those of FIG. 11C are much more uniform in thickness, indicating that the lines/features are vertical and have not bent/tipped over.

The results shown in FIGS. 10A-C and 11A-C indicate that the disclosed process flows may be used to reduce the number of manufacturing defects (e.g., particularly those related to line bending/tipping) when performing spacer-on-spacer self-aligned quadruple patterning techniques. Reduced defects result in improved process efficiency and reduced costs.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing substrates, the method comprising:
   a) receiving a substrate comprising:
      i. underlying material,
      ii. cores positioned on the underlying material, the cores having sidewalls that are vertically oriented, and
      iii. first spacer material lining the sidewalls of the cores;
   b) removing the cores, thereby forming first spacer features from the first spacer material previously lining the sidewalls of the cores; and
   c) depositing a second spacer layer over the first spacer features, wherein (b) and (c) occur in the same reaction chamber, and wherein the substrate is not removed from the reaction chamber between (b) and (c),
   wherein the cores comprise carbon, and
   wherein the carbon of the cores has a post-deposition blanket stress of about 50 MPa or less, and has a Young's modulus of about 30 GPa or greater.

2. The method of claim 1, further comprising cleaning the substrate to remove unwanted material therefrom, wherein the substrate is cleaned in a wet cleaning operation prior to (b).

3. The method of claim 1, further comprising depositing a first spacer layer over the cores, the first spacer layer comprising the first spacer material, and etching back the first spacer layer to remove the first spacer material from horizontal surfaces while leaving the first spacer material on the sidewalls of the cores.

4. The method of claim 1, further comprising performing metrology to determine a time at which the cores are removed during (b).

5. The method of claim 4, wherein performing metrology comprises performing optical emission spectroscopy.

6. The method of claim 5, wherein performing optical emission spectroscopy comprises monitoring a signal associated with the presence of carbon dioxide in the reaction chamber.

7. The method of claim 4, wherein performing metrology comprises performing laser interferometry.

8. The method of claim 1, further comprising performing scatterometry after (b) and before (c) to measure a width of one or more of the first spacer features.

9. The method of claim 1, wherein removing the cores comprises exposing the substrate to an oxygen-containing plasma to ash away the cores.

10. A method of processing substrates, the method comprising:
    a) receiving a substrate comprising:
       i. underlying material, ii. cores positioned on the underlying material, the cores having sidewalls that are vertically oriented,
iii. first spacer material lining the sidewalls of the cores,
iv. a planarizing layer positioned over the cores and first spacer material, a top portion of the planarizing layer being substantially planar,
v. a mask layer positioned over the planarizing layer,
vi. an opening defined in the mask layer and the planarizing layer, the opening positioned above the first spacer material lining one of the sidewalls of one of the cores;

b) removing the first spacer material at a location corresponding to the opening;
c) removing the mask layer;
d) removing the cores and the planarizing layer, thereby forming first spacer features from remaining first spacer material that was not removed in (b), wherein no first spacer feature is formed at the location corresponding to the opening; and
e) depositing a second spacer layer over the first spacer features, wherein (d) and (e) occur in the same reaction chamber, and wherein the substrate is not removed from the reaction chamber between (d) and (e).

11. The method of claim 10, wherein the cores and the planarizing layer are removed simultaneously.

12. The method of claim 10, wherein removing the cores and the planarizing layer comprises exposing the substrate to an oxygen-containing plasma to ash away the cores and the planarizing layer.

13. The method of claim 10, further comprising performing metrology to determine a time at which the cores and/or planarizing layer are removed in (d).

14. The method of claim 10, further comprising performing scatterometry after (d) and before (e) to measure a width of one or more of the first spacer features.

15. A method of processing substrates, the method comprising:
a) receiving a substrate comprising:
i. underlying material,
ii. cores positioned on the underlying material, the cores having sidewalls that are vertically oriented,
iii. first spacer material lining the sidewalls of the cores, and
iv. a planarizing layer positioned over the underlying material, the cores, and the first spacer material, wherein the planarizing layer is patterned to form exposed regions and protected regions;
b) trimming the first spacer material to reduce a thickness of the first spacer material in the exposed regions while the first spacer material in the protected regions remains untrimmed;
c) removing the planarizing layer and the cores, thereby forming first spacer features from the first spacer material, wherein the first spacer features have non-uniform critical dimensions; and
d) forming a second spacer layer over the first spacer features,
wherein (c) and (d) occur in the same reaction chamber, and wherein the substrate is not removed from the reaction chamber between (c) and (d).

16. The method of claim 15, further comprising etching back the second spacer layer such that the second spacer layer is removed in areas between adjacent first spacer features.

17. The method of claim 16, further comprising removing the first spacer features, thereby forming second spacer features from the second spacer layer, wherein a distance between adjacent second spacer features is non-uniform due to the non-uniform critical dimensions of the first spacer features.

18. The method of claim 15, wherein the planarizing layer and the cores are removed simultaneously.

19. The method of claim 18, wherein removing the cores and the planarizing layer comprises exposing the substrate to an oxygen-containing plasma to ash away the cores and the planarizing layer.

* * * * *